United States Patent
Arakawa et al.

(10) Patent No.: US 8,829,658 B2
(45) Date of Patent: Sep. 9, 2014

(54) METHOD OF MANUFACTURING NITRIDE SUBSTRATE, AND NITRIDE SUBSTRATE

(75) Inventors: Satoshi Arakawa, Itami (JP); Michimasa Miyanaga, Itami (JP); Takashi Sakurada, Itami (JP); Yoshiyuki Yamamoto, Itami (JP); Hideaki Nakahata, Itami (JP)

(73) Assignee: Sumitomo Electric Industries, Ltd., Osaka-shi, Osaka (JP)

( * ) Notice: Subject to any disclaimer, the term of this patent is extended or adjusted under 35 U.S.C. 154(b) by 504 days.

(21) Appl. No.: 13/061,307

(22) PCT Filed: Aug. 26, 2009

(86) PCT No.: PCT/JP2009/064852
§ 371 (c)(1),
(2), (4) Date: Feb. 28, 2011

(87) PCT Pub. No.: WO2010/024285
PCT Pub. Date: Mar. 4, 2010

(65) Prior Publication Data
US 2011/0156213 A1    Jun. 30, 2011

(30) Foreign Application Priority Data
Sep. 1, 2008 (JP) ................................. 2008-223809

(51) Int. Cl.
*H01L 29/04* (2006.01)
*C30B 25/00* (2006.01)
*C30B 29/40* (2006.01)
*C30B 33/00* (2006.01)

(52) U.S. Cl.
CPC ............... *C30B 25/00* (2013.01); *C30B 29/403* (2013.01); *C30B 33/00* (2013.01); *C30B 29/406* (2013.01)

USPC .... 257/627; 257/613; 257/628; 257/E33.025; 257/E29.004

(58) Field of Classification Search
USPC .................. 257/613, 615, 627, 628, E33.025, 257/E33.03, E33.043, E27.03, E27.04, 257/E29.003, E29.004
See application file for complete search history.

(56) References Cited

U.S. PATENT DOCUMENTS

2001/0048114 A1   12/2001   Morita et al.
2005/0274975 A1   12/2005   Shibata
(Continued)

FOREIGN PATENT DOCUMENTS

JP     10-335750      12/1998
JP     2005-206424    8/2005
(Continued)

*Primary Examiner* — Matthew E Warren
(74) *Attorney, Agent, or Firm* — Drinker Biddle & Reath LLP

(57) ABSTRACT

A method of manufacturing a nitride substrate includes the following steps. Firstly, a nitride crystal is grown. Then, the nitride substrate including a front surface is cut from the nitride crystal. In the step of cutting, the nitride substrate is cut such that an off angle formed between an axis orthogonal to the front surface and an m-axis or an a-axis is greater than zero. When the nitride crystal is grown in a c-axis direction, in the step of cutting, the nitride substrate is cut from the nitride crystal along a flat plane which passes through a front surface and a rear surface of the nitride crystal and does not pass through a line segment connecting a center of a radius of curvature of the front surface with a center of a radius of curvature of the rear surface of the nitride crystal.

3 Claims, 21 Drawing Sheets

(56) References Cited

U.S. PATENT DOCUMENTS

| | | |
|---|---|---|
| 2005/0274976 A1* | 12/2005 | Shibata .................. 257/189 |
| 2007/0176199 A1 | 8/2007 | Shibata |
| 2007/0254459 A1 | 11/2007 | Lee et al. |
| 2008/0081015 A1 | 4/2008 | Sarayama et al. |
| 2009/0236694 A1 | 9/2009 | Mizuhara et al. |
| 2010/0227532 A1* | 9/2010 | Ishibashi et al. ............. 451/36 |
| 2011/0163323 A1* | 7/2011 | Motoki et al. ............... 257/76 |
| 2012/0315445 A1 | 12/2012 | Mizuhara et al. |
| 2013/0069078 A1 | 3/2013 | Sarayama et al. |
| 2013/0160699 A1 | 6/2013 | Mizuhara et al. |

FOREIGN PATENT DOCUMENTS

| | | |
|---|---|---|
| JP | 2005-350315 | 12/2005 |
| JP | 2007-189221 | 7/2007 |
| JP | 2007-197276 | 8/2007 |
| JP | 2007-277053 | 10/2007 |
| JP | 2007-290960 | 11/2007 |
| JP | 2007-534159 | 11/2007 |
| JP | 2008-110910 A | 5/2008 |
| JP | 2008-143772 A | 6/2008 |
| WO | 2005/050707 A2 | 6/2005 |

* cited by examiner (A)

(B)

METHOD OF MANUFACTURING NITRIDE SUBSTRATE, AND NITRIDE SUBSTRATE

TECHNICAL FIELD

The present invention relates to a method of manufacturing a nitride substrate, and a nitride substrate.

BACKGROUND ART

An AlN (aluminum nitride) crystal has a wide energy band gap of 6.2 eV, a high thermal conductivity of about 3.3 WK$^{-1}$ cm$^{-1}$, and a high electrical resistance. Thus, nitride crystals such as an MN crystal have been attracting attention as materials for semiconductor devices such as optical devices and electronic devices.

A method of manufacturing such a nitride crystal is disclosed, for example, in Japanese Patent Laying-Open No. 2007-197276 (Patent Document 1). In Patent Document 1, a group III-V nitride semiconductor substrate is manufactured by the following steps. Specifically, a group III-V nitride semiconductor film is grown on a substrate of a different type having a c-plane or an off angle. Thereafter, a metal film is deposited on the substrate of a different type, and heat treatment is performed to form cavities in the group nitride semiconductor film. Next, a group III-V nitride semiconductor crystal is deposited on the metal film. Subsequently, the substrate of a different type is delaminated to obtain a group III-V compound semiconductor crystal having a c-axis substantially vertical to a front surface or inclined by a predetermined angle with respect to the front surface. Next, a rear surface of the group III-V nitride semiconductor crystal is polished to obtain a flat surface. A group nitride semiconductor substrate is manufactured by removing the substrate of a different type, the group III-V nitride semiconductor film, and the metal film from the group III-V nitride semiconductor crystal. A semiconductor substrate made of the group III-V nitride semiconductor crystal manufactured as described above has an as-grown front surface.

PRIOR ART DOCUMENTS

Patent Documents

Patent Document 1: Japanese Patent Laying-Open No. 2007-197276

SUMMARY OF THE INVENTION

Problems to be Solved by the Invention

In Patent Document 1, however, the group III-V nitride semiconductor crystal is grown in an as-grown state. That is, an off angle of the front surface of the group III-V nitride semiconductor substrate is controlled only by growth conditions of the group III-V nitride semiconductor crystal. Thus, it has been difficult to manufacture a group III-V nitride semiconductor substrate having a controlled off angle with a high yield.

Therefore, one object of the present invention is to provide a method of manufacturing a nitride substrate by which a nitride substrate having a controlled off angle of a front surface is manufactured with an improved yield, and the nitride substrate.

Means for Solving the Problems

A method of manufacturing a nitride substrate in one aspect of the present invention includes the following steps. Firstly, a nitride crystal is grown. Then, the nitride substrate including a front surface is cut from the nitride crystal. In the step of cutting, the nitride substrate is cut such that an off angle formed between an axis orthogonal to the front surface and an m-axis or an a-axis is greater than zero.

The nitride substrate of the present invention is characterized in that, in the nitride substrate including the front surface, the off angle formed between the axis orthogonal to the front surface and the a-axis or the m-axis is greater than zero.

According to the method of manufacturing a nitride substrate and the nitride substrate in one aspect of the present invention, the nitride substrate is cut from the nitride crystal to have an off angle in the entire front surface. Thus, the nitride substrate having a controlled off angle can be manufactured stably irrespective of the state of the grown nitride crystal (that is, without depending on growth conditions and the like of the nitride crystal). When an epitaxial layer is formed on the front surface of the nitride substrate manufactured as described above, step growth as crystal growth in a lateral direction can be performed. Hence, the epitaxial layer can have good morphology, and thus crystallinity can be improved. Since the crystallinity of the epitaxial layer is improved, properties of a substrate, a device, and the like fabricated using the epitaxial layer can be improved. Therefore, a nitride substrate including a front surface in which an off angle is controlled to form an epitaxial layer with high properties all over the nitride substrate can be manufactured with an improved yield.

A method of manufacturing a nitride substrate in another aspect of the present invention includes the following steps. Firstly, a nitride crystal including a front surface and a rear surface opposite to the front surface is grown in a c-axis direction. Then, the nitride substrate is cut from the nitride crystal. In the step of cutting, the nitride substrate is cut from the nitride crystal along a flat plane which passes through the front surface and the rear surface of the nitride crystal and does not pass through a line segment connecting a center of a radius of curvature of the front surface with a center of a radius of curvature of the rear surface of the nitride crystal.

As a result of earnest study, the inventors of the present invention have found that, when the nitride substrate is cut from the nitride crystal along a flat plane which passes through the line segment connecting the center of the radius of curvature of the front surface with the center of the radius of curvature of the rear surface of the nitride crystal, a front surface of the nitride substrate includes a portion having an off angle of zero. Therefore, according to the method of manufacturing a nitride substrate in another aspect of the present invention, a nitride substrate in which an off angle formed between an axis orthogonal to a front surface and an a-axis or an m-axis is always controlled to be greater than zero can be manufactured. Further, since the nitride substrate is cut from the nitride crystal with the off angle being controlled, a nitride substrate having a controlled off angle can be manufactured stably irrespective of the state of the grown nitride crystal. Therefore, a nitride substrate in which an off angle is controlled to form an epitaxial layer with high properties can be manufactured with an improved yield.

Preferably, in the method of manufacturing a nitride substrate described above, in the step of cutting, the nitride substrate is cut such that the nitride substrate includes the front surface having a first region and a second region surrounding the first region, and the off angle has a minimum value at a first point in the second region.

Further, preferably, in the nitride substrate described above, the front surface has a first region and a second region surrounding the first region, and the off angle of the front surface has a minimum value at a first point in the second region.

Thereby, the off angle in the first region can be further increased, and thus step growth can be further enhanced when an epitaxial layer is formed on the nitride substrate. Hence, an epitaxial layer with higher properties can be formed on the first region located on an inner peripheral side. In a substrate, a device, and the like fabricated using an epitaxial layer, an outer peripheral side is generally less frequently used, and an inner peripheral side is generally more frequently used. Therefore, since properties in a more frequently used region in the substrate, device, and the like can be further improved, a nitride substrate in which an off angle is controlled to form an epitaxial layer with higher properties can be manufactured with an improved yield.

Preferably, in the method of manufacturing a nitride substrate described above, in the step of cutting, the nitride substrate is cut such that the second region is within 2 mm from an edge of the nitride substrate. Further, preferably, in the nitride substrate described above, the second region is within 2 mm from an edge.

Thereby, a wide region other than the second region within 2 mm from the edge of the nitride substrate can serve as the first region. Thus, the wide first region can be used for an epitaxial layer and the like with high properties.

Preferably, in the method of manufacturing a nitride substrate described above, in the step of cutting, the nitride substrate is cut such that the off angle has a maximum value at a second point in the second region, and the off angle monotonically decreases from the second point to the first point.

Further, preferably, in the nitride substrate described above, the off angle has a maximum value at a second point in the second region, and the off angle monotonically decreases from the second point to the first point.

Thereby, since the first region located on the inner peripheral side does not include the minimum value and the maximum value of the off angle, the off angle is not zero, and variations in the off angle can be suppressed. Thus, an epitaxial layer and the like with higher properties can be formed on the first region located on the inner peripheral side.

Preferably, in the method of manufacturing a nitride substrate described above, in the step of cutting, the nitride substrate is cut from the nitride crystal along a flat plane parallel to a flat plane inclined from an a-plane or an m-plane in a c-axis direction. Further, preferably, in the nitride substrate described above, the front surface is inclined from an a-plane or an m-plane in a c-axis direction.

Thereby, properties of an epitaxial layer and the like produced using the nitride substrate can be further improved.

Preferably, the method of manufacturing a nitride substrate described above further includes the step of performing at least one of polishing and grinding of the front surface of the nitride substrate after the step of cutting.

Thereby, the front surface of the nitride substrate can be flattened. Thus, an epitaxial layer and the like can be produced easily using the nitride substrate.

Preferably, in the method of manufacturing a nitride substrate described above, in the step of cutting, a plurality of the nitride substrates are cut. Thereby, manufacturing cost for each nitride substrate can be reduced.

Effects of the Invention

According to the method of manufacturing a nitride substrate and the nitride substrate of the present invention, by cutting the nitride substrate from the nitride crystal with the off angle being controlled, the nitride substrate can be manufactured with an improved yield such that the off angle formed between the axis orthogonal to the front surface and the m-axis or the a-axis is greater than zero.

MODES FOR CARRYING OUT THE INVENTION

Figure 1:
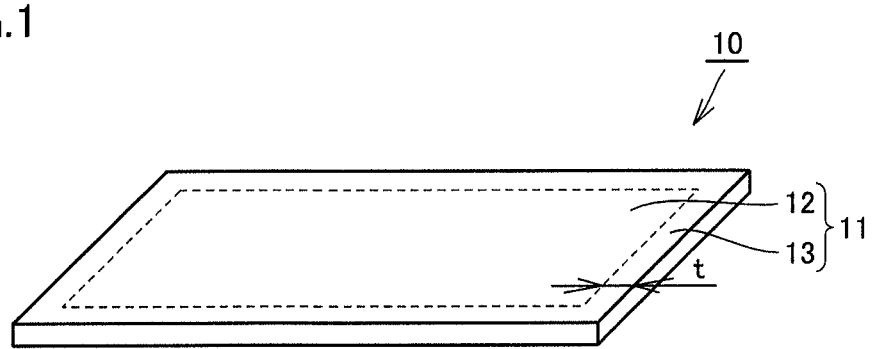
FIG. 1 is a perspective view schematically showing a nitride substrate in an embodiment of the present invention.

Hereinafter, an embodiment of the present invention will be described with reference to the drawings. It is to be noted that, in the drawings below, identical or corresponding parts will be designated by the same reference numerals, and the description thereof will not be repeated. Further, in the present specification, an individual orientation will be indicated by [ ], a group orientation will be indicated by < >, an individual plane will be indicated by ( ) and a group plane will be indicated by { }. In addition, although a negative index is crystallographically supposed to be indicated by placing "-" (a bar) above a numeral, it will be indicated in the present specification by placing a minus sign before a numeral.

FIG. 1 is a perspective view schematically showing a nitride substrate in the present embodiment. Firstly, referring to FIG. 1, the nitride substrate in the present embodiment will be described.

As shown in FIG. 1, a nitride substrate 10 includes a front surface 11. Front surface 11 has a first region 12 and a second region 13 surrounding the first region 12.

That is, the first region 12 is located on an inner peripheral side in front surface 11 of nitride substrate 10, and the second region 13 is located on an outer peripheral side in front surface 11 of nitride substrate 10. The first region 12 in the present embodiment is a region in front surface 11 of nitride substrate 10 in which, of an epitaxial layer formed on front surface 11, an epitaxial layer used for a substrate or a device is formed. Of the epitaxial layer formed on front surface 11, the second region 13 not used for a substrate or a device has a distance t of, for example, within 2 mm from an edge.

FIGS. 2 to 5 are schematic views showing off angles when the nitride substrate in the present embodiment is seen from above (a front surface side). In FIGS. 2 to 5, an arrow is a vector indicating the magnitude and direction of an off angle. Further, in FIGS. 2 to 5, a represents an a-axis direction, m represents an m-axis direction, and c represents an c-axis direction, indicating directions at a center of front surface 11 of nitride substrate 10. As shown in FIGS. 2 to 5, an off angle formed between an axis orthogonal to front surface 11 and an m-axis or an a-axis is greater than zero in entire front surface 11. That is, front surface 11 does not include a region where the off angle is zero.

Figure 2:
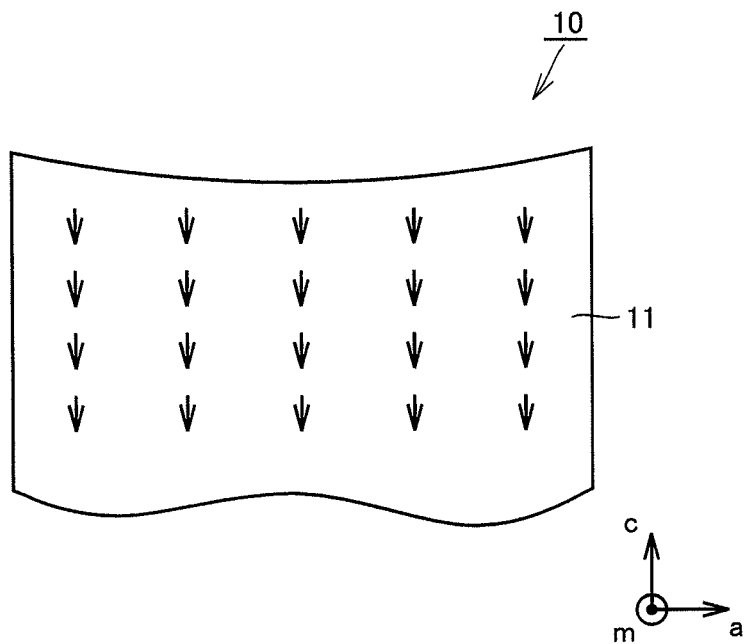
FIG. 2 is a schematic view showing an off angle when the nitride substrate in the embodiment of the present invention is seen from above (a front surface side).
Figure 3:
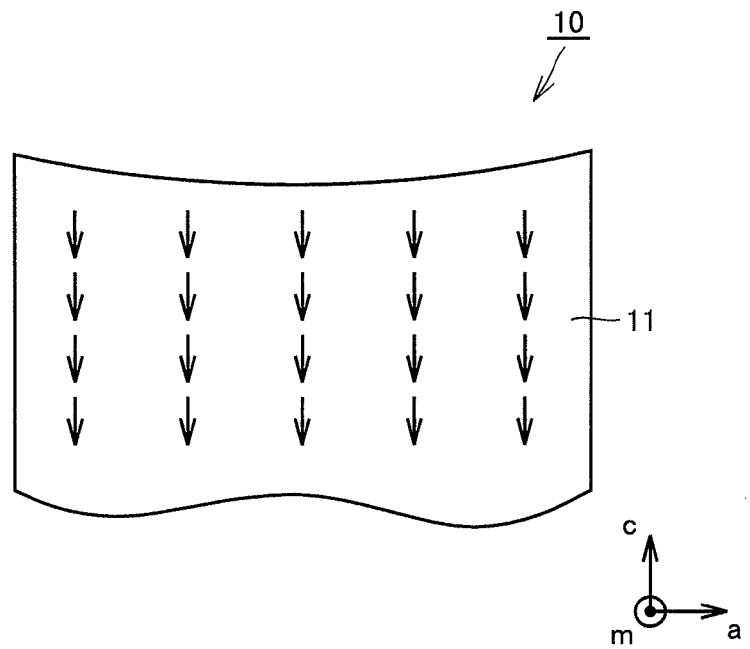
FIG. 3 is a schematic view showing an off angle when the nitride substrate in the embodiment of the present invention is seen from above (the front surface side).
Figure 4:
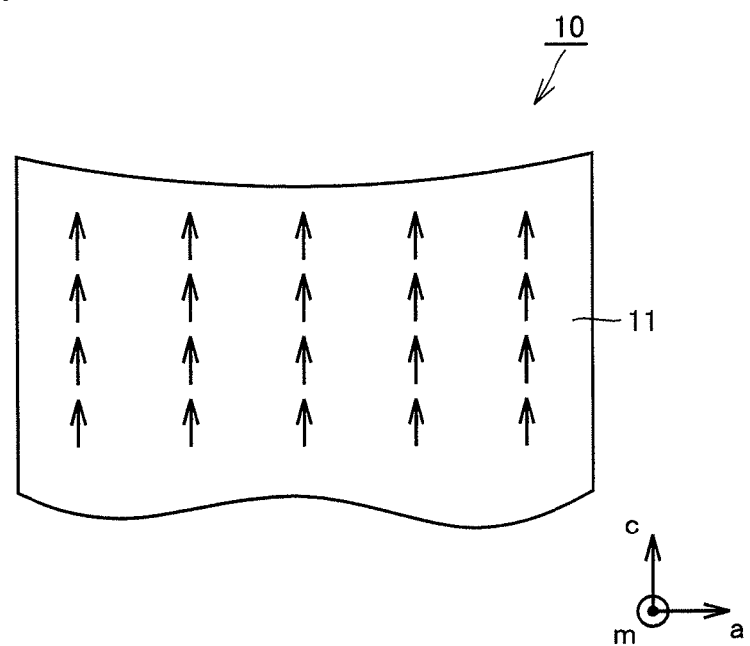
FIG. 4 is a schematic view showing an off angle when the nitride substrate in the embodiment of the present invention is seen from above (the front surface side).
Figure 5:
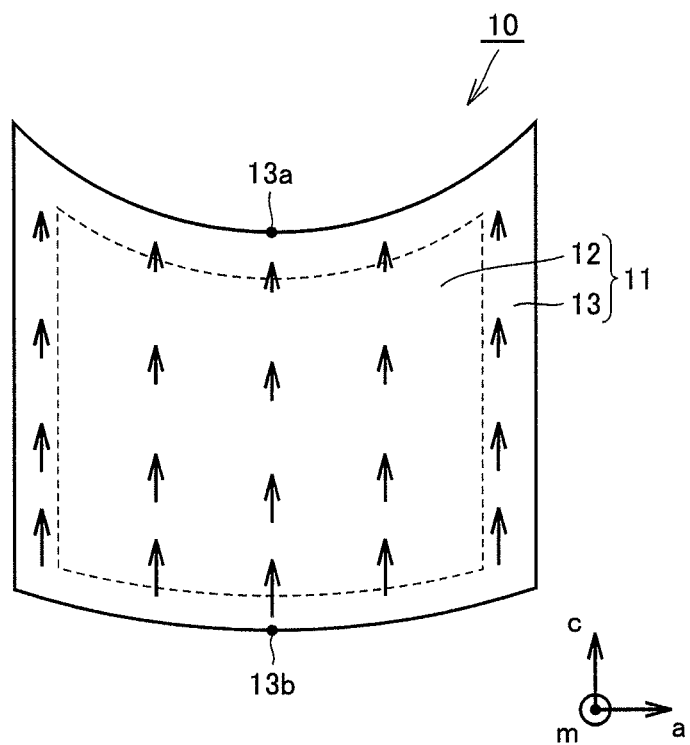
FIG. 5 is a schematic view showing an off angle when the nitride substrate in the embodiment of the present invention is seen from above (the front surface side).

The off angle of front surface 11 may have the same magnitude as shown in FIGS. 2 to 4, or may have variations in magnitude as shown in FIG. 5. Further, the direction of the off angle may be always constant as shown in FIGS. 2 to 5, or may be different (not shown).

When the off angle of front surface 11 has variations in magnitude as shown in FIG. 5, the off angle has a minimum value at a first point 13a in the second region 13. The off angle has a maximum value at a second point 13b in the second region 13. The off angle monotonically decreases from the second point 13b to the first point 13a. It is to be noted that monotonic decrease means that the magnitude of the off angle is always identical or decreases from the second point 13b to the first point 13a, and the off angle at the first point 13a is smaller than the off angle at the second point 13b. That is, monotonic decrease does not include a portion in which the off angle increases from the second point 13b to the first point 13a.

Further, front surface 11 is inclined from an a-plane or an m-plane in the c-axis direction. It is to be noted that a c-plane refers to a {0001} plane, including a (0001) plane, a (000-1) plane, and planes parallel thereto. The m-axis direction refers to a <1-100> direction, including a [1-100] direction, a [10-10] direction, a [-1100] direction, a [-1010] direction, a [0-10] direction, and a [0-110] direction. Further, the a-axis direction refers to a <11-20> direction, including a [11-20] direction, a [1-210] direction, a [-2110] direction, a [-1-120] direction, a [-12-10] direction, and a [2-1-10] direction.

The off angle in at least the first region 12 of front surface 11 is preferably not less than 0.15° and less than 2°, and more preferably not less than 0.3° and less than 0.7°. Within this range, an epitaxial layer with high properties can be formed on at least the first region 12.

Nitride substrate 10 of the present embodiment has front surface 11 in the shape of a rectangular plate. If front surface 11 is rectangular, it is preferable that a maximum value of a distance between one point and another point on the edge of front surface 11 is not less than 5 mm. If front surface 11 is circular or elliptical, it is preferable that the longest diameter is not less than 10 mm.

Nitride substrate 10 is, for example, $In_xAl_yGa_{(1-x-y)}N$ ($0 \leq x \leq 1$, $0 \leq y \leq 1$, $0 \leq x+y \leq 1$) and preferably gallium nitride (GaN), AlN, AlGaN, or the like.

Next, a method of manufacturing the nitride substrate in the present embodiment will be described.

FIGS. 6(A) and 6(B) are cross sectional views schematically showing a nitride crystal in the present embodiment. FIG. 7 is a growth apparatus capable of being used to manufacture the nitride crystal in the present embodiment. As shown in FIGS. 6(A), 6(B), and 7, firstly, a nitride crystal 22 is grown. Nitride crystal 22 is an ingot for manufacturing nitride substrate 10. In the present embodiment, nitride crystal 22 is grown, for example, by a sublimation method.

Here, main components of a growth apparatus 100 in the present embodiment will be described with reference to FIG. 7. Growth apparatus 100 is an apparatus for growing a crystal by the sublimation method.

As shown in FIG. 7, growth apparatus 100 mainly includes a crucible 101, a heat body 121, a reaction vessel 123, and a heating portion 125.

Crucible 101 is made of, for example, graphite. Crucible 101 has an air exhaust outlet 101a. Heat body 121 is provided around crucible 101 in a manner ensuring ventilation between an interior and an exterior of crucible 101. Reaction vessel 123 is provided around heat body 121. Heating portion 125 such as a high frequency heating coil for heating heat body 121 is provided at an outer central portion of reaction vessel 123.

At one ends of heat body 121 and reaction vessel 123, inlets 121a, 123a for allowing a carrier gas such as nitrogen gas to flow into crucible 101 disposed within reaction vessel 123, and outlets 121b, 123b for emitting the carrier gas to an exterior of reaction vessel 123 are provided. Further, above and below reaction vessel 123, radiation thermometers 127a, 127b for measuring temperatures above and below crucible 101 are provided.

Although growth apparatus 100 described above may include various elements other than those described above, for convenience of explanation, these elements will not be shown and described.

Firstly, a base substrate 21 is prepared. The base substrate is not particularly limited, and may be a substrate of a different type such as an SiC (silicon carbide) substrate, or may be made of a material identical to that of nitride crystal 22 to be grown. In the present embodiment, for example, an SiC substrate having a (0001) plane as a main surface is prepared as base substrate 21. Base substrate 21 is placed at an upper portion of crucible 101. On this occasion, a front surface of base substrate 21 is flattened, and a base substrate protection material made of, for example, graphite is placed on a rear surface side to closely adhere thereto to suppress sublimation of base substrate 21.

Thereafter, a raw material 17 is prepared. If an MN crystal is grown as nitride crystal 22, for example, an AlN powder or the like is used as raw material 17. Raw material 17 is placed at a lower portion of crucible 101 to face base substrate 21 with each other.

Thereafter, the temperature within crucible 101 is increased by heating heat body 121 using heating portion 125 while causing the nitrogen gas to flow into reaction vessel 123. Then, raw material 17 is heated up to a temperature at which raw material 17 sublimates. Through the heating, raw material 17 sublimates and generates a sublimation gas. The sublimation gas is solidified again on the front surface of base substrate 21 set at a temperature lower than that of raw material 17. In the present embodiment, heating is performed such that, for example, base substrate 21 has a temperature of 2000° C. and raw material 17 has a temperature of 2200° C., to grow a nitride crystal having a thickness of 30 μm, and the nitride crystal is further grown for 100 hours. Thereby, a nitride crystal having a thickness of, for example, 10 mm can be grown. Thereafter, the nitride crystal is cooled down to a room temperature (for example, 25° C.), and taken out from growth apparatus 100. Thereby, the nitride crystal can be grown on base substrate 21. Thereafter, raw material 17 is further replenished to further grow a nitride crystal on the nitride crystal. Thereby, as shown in FIG. 6(A) or 6(B), nitride crystal 22 having a thickness of, for example, 19 mm is obtained. A front surface 22a of nitride crystal 22 is warped in a concave shape. Further, a rear surface 22b of nitride crystal 22 may be warped. Warpages of front surface 22a and rear surface 22b may be identical as shown in FIG. 6(B), or may be different as shown in FIG. 6(A). It is to be noted that, as shown in FIG. 6(B), base substrate 21 may sublimate due to the growth of nitride crystal 22.

Although the sublimation method is employed as a method of growing nitride crystal 22 in the present embodiment, the method of growing nitride crystal 22 is not particularly limited to the sublimation method, and, for example, a vapor deposition method such an HYPE (Hydride Vapor Phase Epitaxy) method, an MBE (Molecular Beam Epitaxy) method, and an MOCVD (Metal Organic Chemical Vapor Deposition) method, a flux method, and a liquid phase method such as a high nitrogen pressure solution method can be employed.

For example, when nitride crystal 22 is grown by the HVPE method, it is grown, for example, as described below. Firstly, base substrate 21 is prepared. As base substrate 21, for example, a GaAs (gallium arsenide) substrate having a (111) plane as a main surface is used. Thereafter, a mask is formed on base substrate 21, and nitride crystal 22 is grown by the HVPE method. As nitride crystal 22, a GaN crystal having a thickness of, for example, 10 mm is grown. Thereafter, the base substrate is removed by etching with, for example, aqua regia. Thereby, nitride crystal 22 shown in FIG. 6(B) is obtained.

Figure 8:
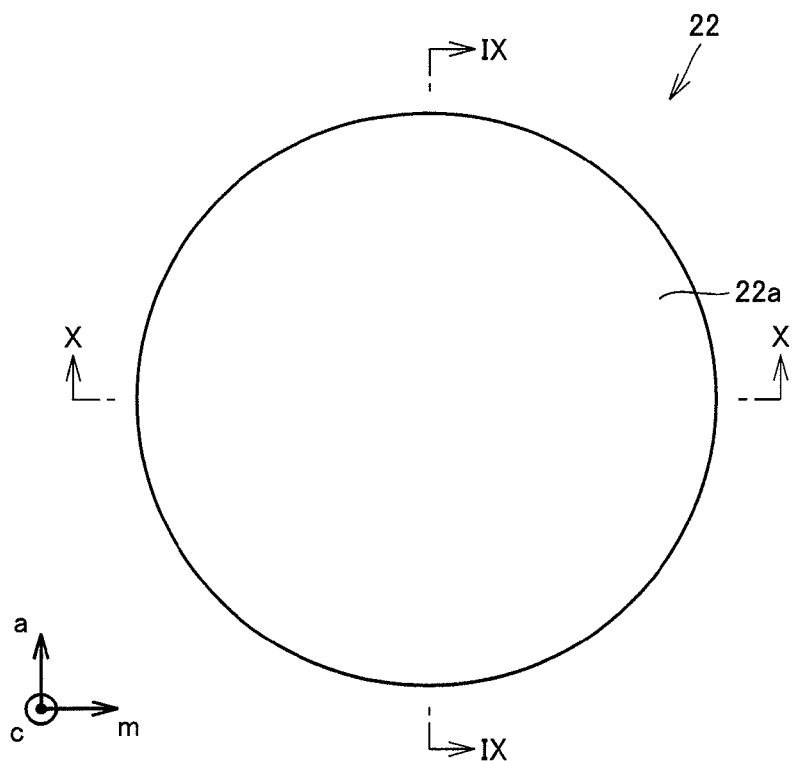
FIG. 8 is a schematic plan view of the nitride crystal in the present embodiment seen from above.
Figure 9:
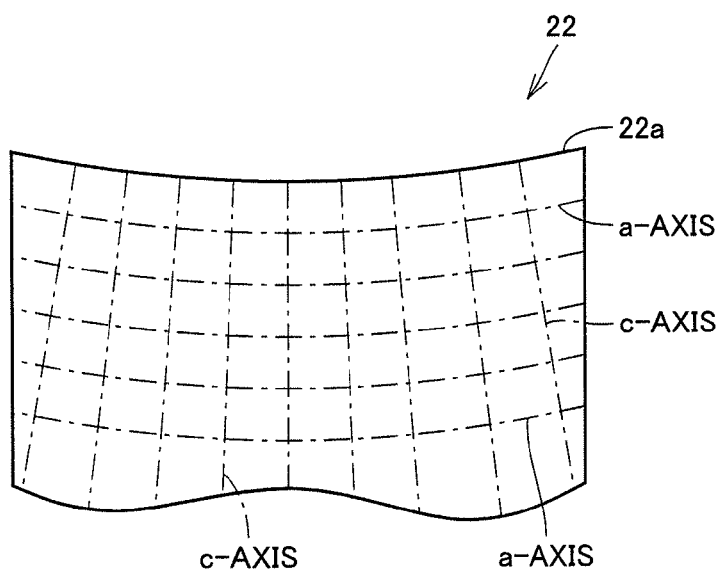
FIG. 9 is a cross sectional view taken along a line IX-IX in FIG. 8, and a schematic view schematically showing a crystal orientation of the nitride crystal.
Figure 10:
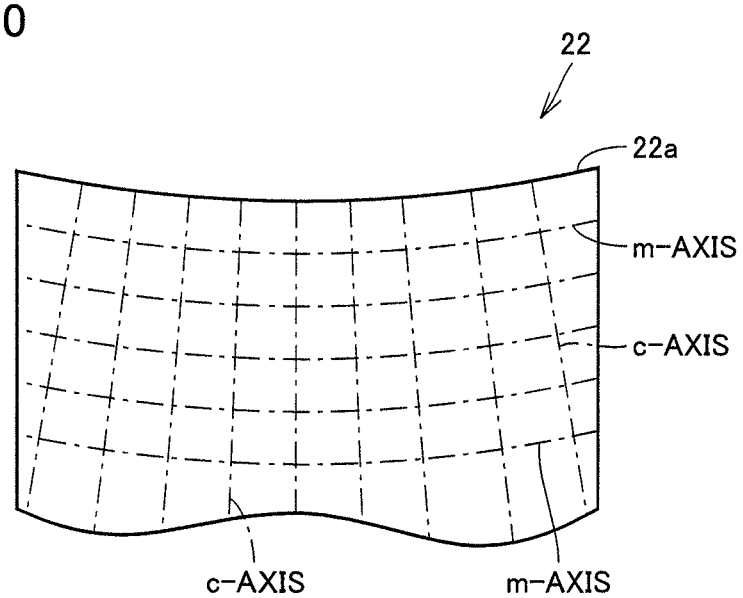
FIG. 10 is a cross sectional view taken along a line X-X in FIG. 8, and a schematic view schematically showing a crystal orientation of the nitride crystal.

FIG. 8 is a schematic plan view of the nitride crystal in the present embodiment seen from above. FIGS. 9 and 10 are cross sectional views taken along a line IX-IX and a line X-X in FIG. 8, and schematic views schematically showing crystal orientations of the nitride crystal. In FIGS. 9 and 10, a dashed line indicates the c-axis direction, the a-axis direction, or the m-axis direction at each position. Front surface 22a of nitride crystal 22 grown as described above is warped in a concave shape as shown in FIGS. 6(A), 6(B), 9, and 10. In the present embodiment, since nitride crystal 22 is grown in the c-axis direction, or front surface 22a, rear surface 22b, or an inside lattice plane of nitride crystal 22 is warped, an orientation of the c-axis, the a-axis, or the m-axis is different depending on a position in nitride crystal 22.

Since nitride substrate 10 is cut from nitride crystal 22 in the present embodiment, nitride crystal 22 having a large thickness is grown as an ingot. When nitride crystal 22 having a large thickness is grown, front surface 22a of nitride crystal 22 is warped. Therefore, an off angle formed between front surface 22a of nitride crystal 22 and the a-axis or the m-axis varies depending on a position in front surface 22a. The same applies to rear surface 22b.

Further, difference in the orientation of the c-axis, the m-axis, or the a-axis for each position in front surface 22a of nitride crystal 22 is measured, for example, by an X-ray Diffraction (XRD) method. Measurement is similarly performed in rear surface 22b. In addition, measurement is similarly performed for the inside of nitride crystal 22, by exposing a location thereof.

Next, nitride substrate 10 including front surface 11 having the first region 12 and the second region 13 surrounding the first region 12 is cut from nitride crystal 22. In the step of cutting, nitride substrate 10 is cut such that the off angle formed between the axis orthogonal to front surface 11 and the m-axis or the a-axis is greater than zero.

In the step of cutting, it is preferable that nitride substrate 10 is cut such that the off angle formed between the axis orthogonal to front surface 11 and the m-axis or the a-axis has a minimum value at the first point 13a in the second region 13. Further, it is preferable that nitride substrate 10 is cut such that the second region 13 is within 2 mm from an edge of nitride substrate 10. Furthermore, in the step of cutting, it is preferable that nitride substrate 10 is cut such that the off angle has a maximum value at the second point in the second region 13, and the off angle monotonically decreases from the second point 13b to the first point 13a.

Figure 11:
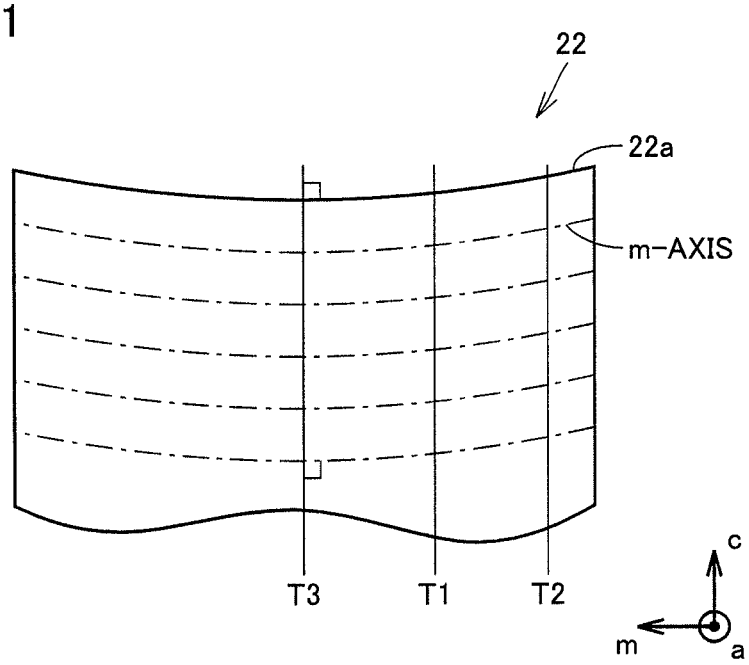
FIG. 11 is a cross sectional view showing the nitride crystal in the embodiment of the present invention.

Here, the step of cutting will be described more specifically. FIG. 11 is a cross sectional view showing nitride crystal 22 in the present embodiment. In FIG. 11, a represents the a-axis direction, m represents the m-axis direction, and c represents the c-axis direction, indicating directions of the axes at a center of nitride crystal 22. In a case where it can be considered that front surface 22a and rear surface 22b of nitride crystal 22 have the same radius of curvature, nitride substrates 10 are cut from nitride crystal 22 along flat planes T1, T2 parallel to the m-plane at a center of front surface 22a as shown for example in FIG. 11. Flat planes T1, T2 are not orthogonal to the m-axis of front surface 22a and rear surface 22b of nitride crystal 22. Front surfaces 11 of nitride substrates 10 cut along flat planes T1, T2 have off angles as shown in FIGS. 2 and 3, respectively. Since flat plane T2 has an inclination from the m-plane in the c-axis direction greater than that of flat plane T1, flat plane T2 has a greater off angle.

Figure 12:
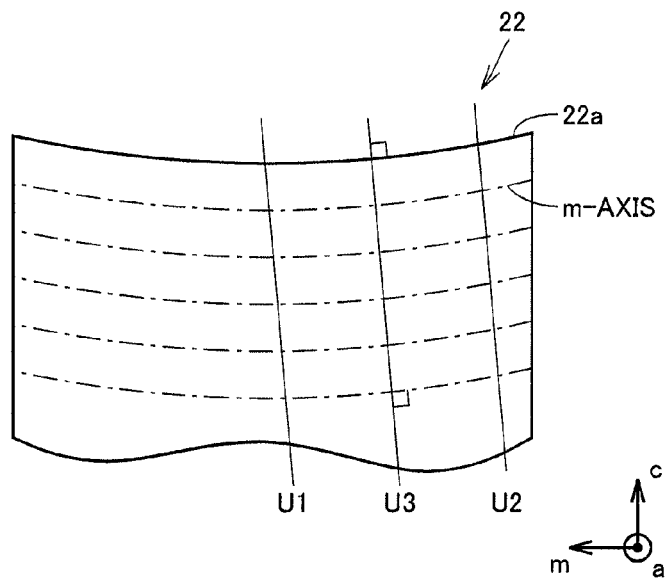
FIG. 12 is another cross sectional view showing the nitride crystal in the embodiment of the present invention.

FIG. 12 is another cross sectional view showing nitride crystal 22 in the present embodiment. In FIG. 12, a represents the a-axis direction, m represents the m-axis direction, and c represents the c-axis direction, indicating the axes at the center of nitride crystal 22. In the case where it can be considered that front surface 22a and rear surface 22b of nitride crystal 22 have the same radius of curvature, nitride substrates 10 are cut from nitride crystal 22 along flat planes U1, U2 parallel to a flat plane inclined from the m-plane at the center of front surface 22a in the c-axis direction as shown for example in FIG. 12. Flat planes U1, U2 are planes inclined from a direction in which the nitride crystal is grown (i.e., the c-axis direction at the center). In the present embodiment, flat planes U1,U2 are inclined by 0.2° from a flat plane vertical to the c-plane at the center of front surface 22a of nitride crystal 22. Flat planes U1, U2 are not orthogonal to the m-axis of front surface 22a and rear surface 22b of nitride crystal 22. Front surfaces 11 of nitride substrates 10 cut along flat planes U1, U2 have off angles as shown in FIGS. 4 and 3, respectively, and the orientations of the off angles are opposite to each other.

Figure 13:
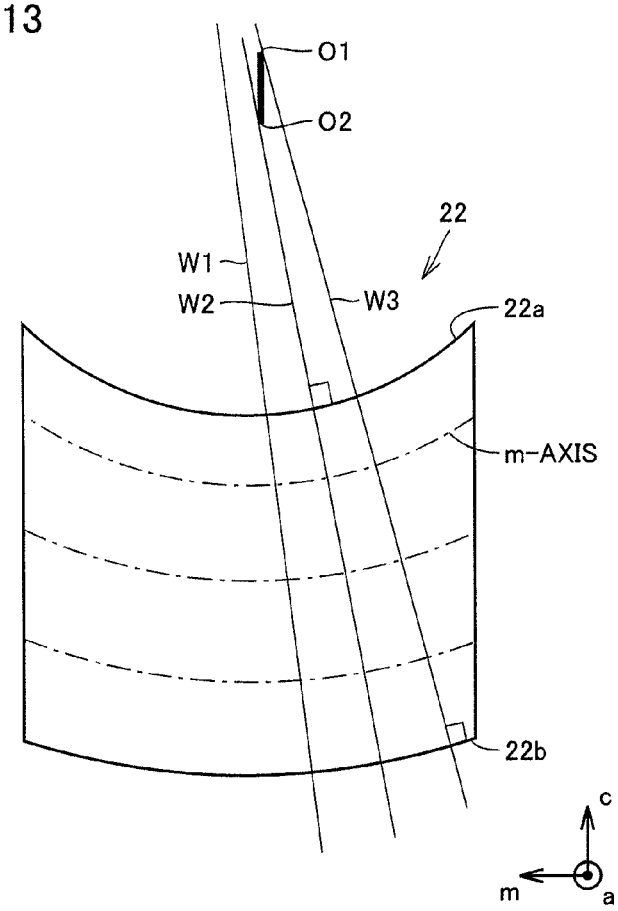
FIG. 13 is another cross sectional view showing the nitride crystal in the embodiment of the present invention.

FIG. 13 is another cross sectional view showing nitride crystal 22 in the present embodiment. In FIG. 13, a represents the a-axis direction, m represents the m-axis direction, and c represents the c-axis direction, indicating directions of the axes at the center of front surface 22a of nitride crystal 22. As shown in FIG. 13, in a case where nitride crystal 22 is grown in the c-axis direction, nitride substrate 10 is cut from nitride crystal 22 along a flat plane W1 which passes through front surface 22a and rear surface 22b of nitride crystal 22 and does not pass through centers of the radii of curvature of front surface 22a and rear surface 22b of nitride crystal 22 (a center O1 and a center O2) and therebetween (a line segment connecting center O1 with center O2). That is, flat plane W1 is not orthogonal to the m-axis of front surface 22a and rear surface 22b of nitride crystal 22. In further other words, flat plane W1 is not located between center O1 of the radius of curvature of front surface 22a and center O2 of the radius of curvature of rear surface 22b of nitride crystal 22. Namely, flat plane W1 is not orthogonal to the m-axis in entire nitride crystal 22. Front surface 11 of nitride substrate 10 cut along flat plane W1 has an off angle as shown in FIG. 5.

Here, the "radii of curvature of front surface 22a and rear surface 22b" mean radii when curves of front surface 22a and rear surface 22b of nitride crystal 22 are approximated as arcs. In addition, the "center of the radius of curvature" means a center of the above approximated arc.

Further, based on the crystal orientation of nitride crystal 22 measured for example by the XRD method, nitride substrate 10 can be cut from nitride crystal 22 as shown in FIGS. 11 to 13.

Preferably, nitride substrate 10 is cut from nitride crystal 22 along a flat plane parallel to a flat plane inclined from the a-plane or the m-plane in the c-axis direction, such as flat planes U1, U2, W1. Particularly preferably, nitride substrate 10 is cut from nitride crystal 22 along a flat plane parallel to a flat plane inclined from the a-plane or the m-plane located at the center of nitride crystal 22 in the c-axis direction. In a case where front surface 22a of nitride crystal 22 has a polygonal shape, the center of nitride crystal 22 means a center of a maximum length of diameters of circles inscribed in arbitrarily specified opposing two sides sandwiching a central portion in front surface 22a. In a case where front surface 22a of nitride crystal 22 has a circular or elliptical shape, the center of nitride crystal 22 means a center of a maximum length of diameters arbitrarily specified in front surface 22a.

In the step of cutting, it is preferable to cut a plurality of nitride substrates 10. If nitride crystal 22 has a size of, for example, not less than 10 mm, the plurality of nitride substrates 10 can be easily cut.

A method of cutting nitride substrate 10 is not particularly limited, and for example, a mechanical method such as slicing can be used. Slicing refers to mechanically cutting nitride substrate 10 from nitride crystal 22 with a slicer having an outer peripheral cutting edge, a slicer having an inner peripheral cutting edge, a wire saw, or the like.

Nitride substrate 10 manufactured as described above does not include a region where the off angle formed between the axis orthogonal to the front surface and the a-axis or the m-axis is zero.

Next, at least one of polishing and grinding of the front surface of nitride substrate 10 is performed as necessary. Grinding refers to grinding down the front surface in a thickness direction by bringing a rotating grindstone to be in contact with the front surface. Since particle detachment can be suppressed in nitride substrate 10 during polishing and grinding, front surface 11 can be easily flattened. It is to be noted that at least one of polishing and grinding of the rear surface of nitride substrate 10 may further be performed.

In the present embodiment, nitride substrate 10 is shaped using a grindstone having diamond abrasive grains fixed thereto, and thereafter front surface 11 of nitride substrate 10 is ground or polished using diamond abrasive grains.

By performing the above steps, a plurality of nitride substrates 10 having a thickness of, for example, 400 μm to 450 μm can be manufactured.

Next, an effect of nitride substrate 10 manufactured by the method of manufacturing nitride substrate 10 in the present embodiment will be described.

In the present embodiment, nitride substrates 10 are cut from nitride crystal 22 along flat planes T1, T2 of FIG. 11 and flat planes U1, U2 of FIG. 12 not orthogonal to the m-axis and the a-axis of front surface 22a and rear surface 22b. Thereby, nitride substrates 10 in which the off angle formed between the axis orthogonal to the front surface and the m-axis or the a-axis is greater than zero as shown in FIGS. 2, 3, 4, and 3, respectively, can be manufactured.

Figure 14:
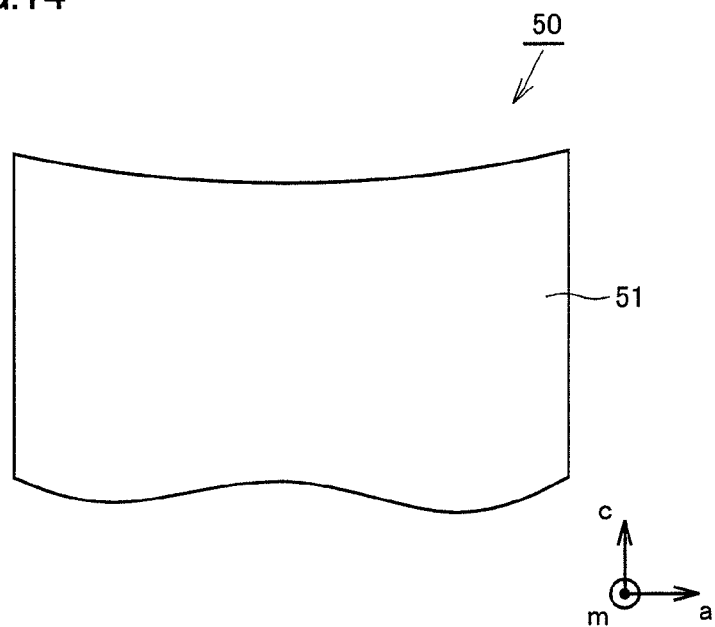
FIG. 14 is a schematic view showing an off angle when a nitride substrate obtained in a comparative example is seen from a direction vertical to a front surface.

On the other hand, in a comparative example, nitride substrates 50 (see FIG. 14) are cut from nitride crystal 22 along a flat plane T3 of FIG. 11 and a flat plane U3 of FIG. 12 in which at least one of front surface 22a and rear surface 22b is orthogonal to the m-axis or the a-axis. Since both front surface 22a and rear surface 22b are orthogonal to the m-axis or the a-axis in the case of the comparative example, an off angle is zero in an entire front surface 51 of nitride substrate 50 as shown in FIG. 14. FIG. 14 is a schematic view showing an off angle when the nitride substrate obtained in the comparative example is seen from a direction vertical to the front surface. In FIG. 14, a represents the a-axis direction, m represents the m-axis direction, and c represents the c-axis direction, indicating directions at a center of front surface 51 of nitride substrate 50. No arrows are illustrated in FIG. 14 because the magnitude of the vector indicating the off angle is zero in the entire front surface 51 of nitride substrate 50.

An epitaxial layer is formed on each of front surface 11 of nitride substrate 10 in the present embodiment and front surface 51 of nitride substrate 50 in the comparative example manufactured as described above. Since the epitaxial layer formed on a region having an off angle is crystal-grown in a lateral direction, the epitaxial layer grown on front surface 11 of nitride substrate 10 has good front surface morphology. That is, an epitaxial layer with high properties can be formed on nitride substrate 10 having front surface 11 in which the off angle is formed entirely as in the present embodiment. Thus, properties of a substrate, a device, and the like fabricated using the epitaxial layer can be improved in a wide range. Therefore, nitride substrate 10 in the present embodiment can control the off angle such that properties of the epitaxial layer formed on front surface 11 and a device using the same are improved.

On the other hand, an epitaxial layer with high properties cannot be formed on a region where an off angle is zero. Therefore, the epitaxial layer grown on front surface 51 of nitride substrate 50 in the comparative example cannot obtain good morphology. That is, an epitaxial layer with high properties cannot be formed on nitride substrate 50 having front surface 51 in which the off angle is not formed entirely as in the comparative example. Thus, it is not possible to improve properties of a substrate, a device, and the like fabricated using the epitaxial layer. Therefore, nitride substrate 50 in the comparative example cannot control the off angle such that properties of the epitaxial layer formed on front surface 51 and a device using the same are improved.

Further, as a result of earnestly studying the position and angle at which nitride substrate 10 is cut from nitride crystal 22, the inventors of the present invention have found that, when the nitride substrates are cut along flat planes W2, W3 which pass through centers O1, O2 of the radii of curvature of front surface 22a and rear surface 22b of nitride crystal 22 as shown in FIG. 13, the front surfaces of the cut nitride substrates have an off angle of zero. Thus, in the present embodiment, nitride substrate 10 is cut from nitride crystal 22 along flat plane W1 which passes through front surface 22a and rear surface 22b of nitride crystal 22 and does not pass through centers O1, O2 of the radii of curvature of front surface 22a and rear surface 22b of nitride crystal 22 (flat plane W1 which does not pass through the line segment connecting centers O1 and O2 of the radii of curvature) as shown in FIG. 13. Thereby, nitride substrate 10 in which the off angle formed between the axis orthogonal to the front surface and the m-axis or the a-axis is greater than zero as shown in FIG. 5 can be manufactured.

Figure 15:
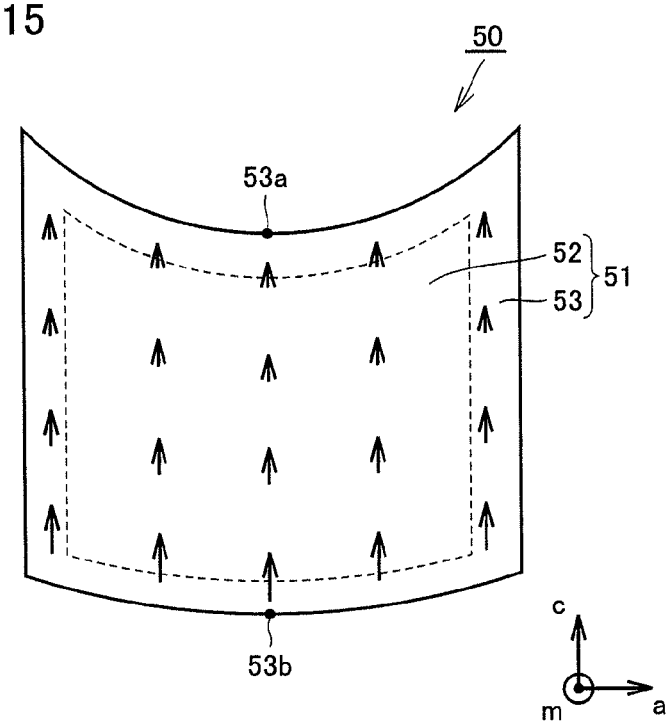
FIG. 15 is a schematic view showing an off angle when the nitride substrate obtained in the comparative example is seen from the vertical direction.
Figure 16:
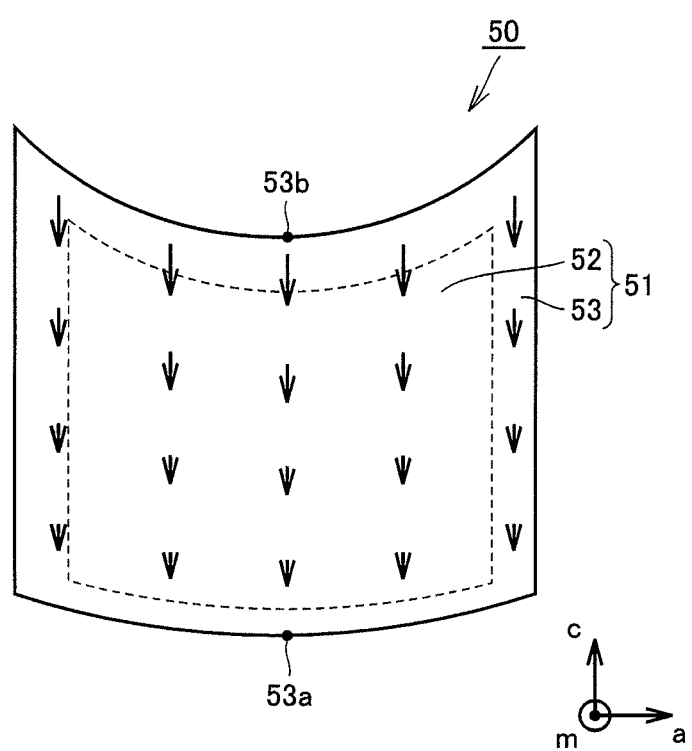
FIG. 16 is a schematic view showing an off angle when the nitride substrate obtained in the comparative example is seen from the vertical direction.

Further, as the comparative example, nitride substrates 50 are cut from nitride crystal 22 along flat planes W2, W3 which pass through front surface 22a and rear surface 22b of nitride crystal 22 and pass through centers O1, O2 of the radii of curvature of front surface 22a and rear surface 22b of nitride crystal 22. Thereby, nitride substrates 50 each including a second region 53 having a first point 53a at which an off angle formed between an axis orthogonal to front surface 51 and the m-axis or the a-axis is zero, and a first region 52 located on an inner peripheral side of the second region 53 are manufactured as shown in FIGS. 15 and 16. FIGS. 15 and 16 are schematic views showing off angles when the nitride substrates obtained in the comparative example are seen from the direction vertical to the front surface. In FIGS. 15 and 16, an arrow is a vector indicating the magnitude and direction of an off angle. In FIGS. 15 and 16, a represents the a-axis direction, m represents the m-axis direction, and c represents the c-axis direction, indicating directions at the center of front surface 51 of nitride substrate 50.

Further, in a case where front surface 22a and rear surface 22b of nitride crystal 22 have different radii of curvature, nitride substrate 10 having an off angle with a minimum value at the first point 13 a in the second region 13 can be manufactured when nitride substrate 10 is cut from nitride crystal 22 along flat plane W1 which does not pass the line segment connecting centers O1 and O2 of the radii of curvature of front surface 22a and rear surface 22b of nitride crystal 22 as shown in FIG. 13.

The epitaxial layer formed on the first region 12 located on the inner peripheral side on front surface 11 of nitride substrate 10 is used for a substrate, a device, and the like. Thus, in the present embodiment, the off angle of nitride substrate 10 is controlled such that the off angle in the second region 13 of nitride substrate 10 as a region not substantially used for a substrate, a device, and the like has a minimum value. Therefore, when an epitaxial layer is formed using nitride substrate 10 and used for a substrate, a device, and the like, the off angle can be controlled to further improve properties of a region to be used, that is, the first region 12.

In addition, in the present embodiment, nitride substrate 10 is cut from nitride crystal 22 to have front surface 11 in which the off angle is controlled. Thus, nitride substrate 10 having a controlled off angle can be manufactured stably irrespective of the state of nitride crystal 22 (that is, without depending on growth conditions and the like of nitride crystal 22). Therefore, nitride substrate 10 in which the off angle is controlled to form an epitaxial layer with high properties can be manufactured with an improved yield.

When nitride crystal 22 is grown in the c-axis direction, nitride crystal 22 is generally warped in a concave shape with respect to the c-axis direction. In the present embodiment, in view of the warped shape, nitride substrate 10 is cut to control distribution of the off angle formed between the axis orthogonal to the front surface and the m-axis or the a-axis. Thus, nitride substrate 10 in which the off angle formed between the axis orthogonal to the front surface and the m-axis or the a-axis of the front surface is controlled can be manufactured with an improved yield.

EXAMPLE 1

In the present example, a slicing method in the step of cutting the nitride substrate from the nitride crystal such that the off angle formed between the axis orthogonal to the front surface and the m-axis or the a-axis is greater than zero was considered.

(Slicing Method 1)

Figure 17:
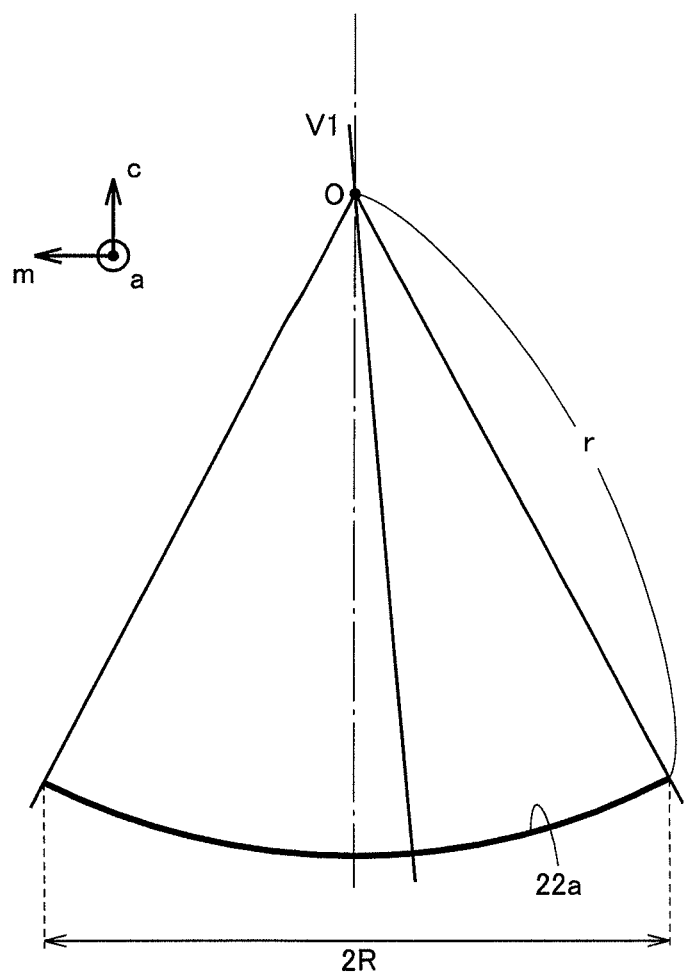
FIG. 17 is a schematic view of a nitride crystal with a diameter 2R having a front surface 22a that can be approximated as a portion of an arc with a radius r and a center O in Example 1, seen from substantially an a-axis direction.
Figure 18:
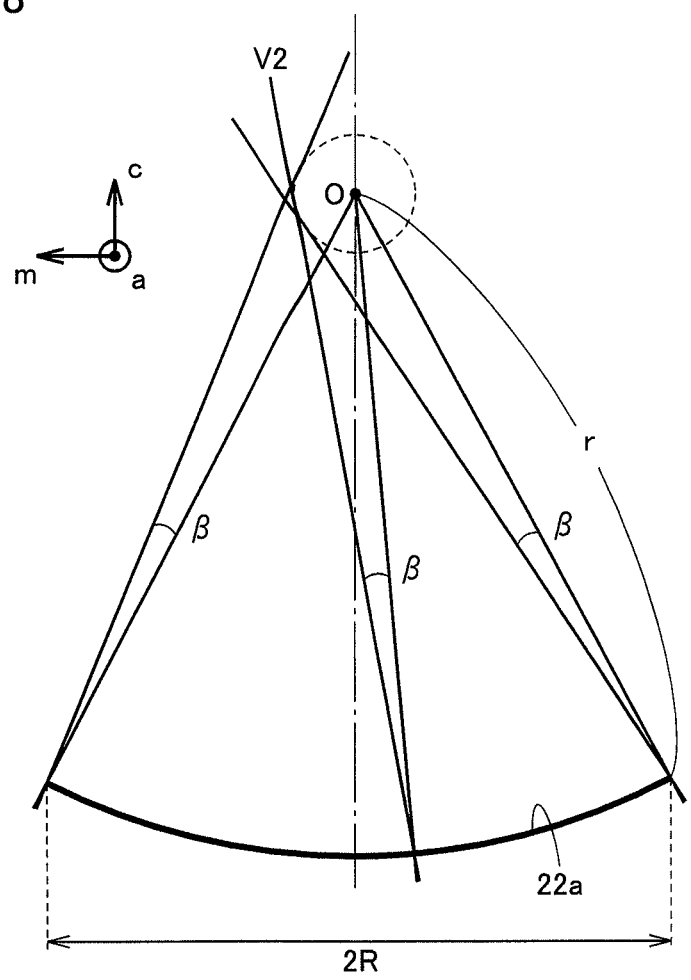
FIG. 18 is a schematic view of the nitride crystal with diameter 2R having front surface 22a that can be approximated as a portion of the arc with radius r and center O in Example 1, seen from substantially the a-axis direction.

FIGS. 17 and 18 are schematic views of a nitride crystal with a diameter 2R having front surface 22a that can be approximated as a portion of an arc with a radius r and a center O (i.e., with r as a radius of curvature and O as the center of the radius of curvature), seen from substantially the a-axis direction. Here, the thickness of the nitride crystal will be ignored for brevity.

Firstly, a method of cutting a nitride substrate in which an off angle from the m-plane is zero in the example shown in FIG. 17 will be considered. In this case, the nitride substrate is obtained, for example, by slicing a nitride crystal along a flat plane vertical to front surface 22a of the nitride crystal as represented by a flat plane V1. As a result of generalization, any plane having a portion common to the nitride crystal, of planes as represented by straight lines passing through center O, falls under the above flat plane.

Next, a method of cutting a nitride substrate in which an off angle from the m-plane is β in the example shown in FIG. 18 will be considered. In this case, as is clear from the result of FIG. 17, the nitride substrate can be obtained by slicing the nitride crystal along a flat plane as represented by a flat plane V2 slightly deviated from center O.

Figure 19:
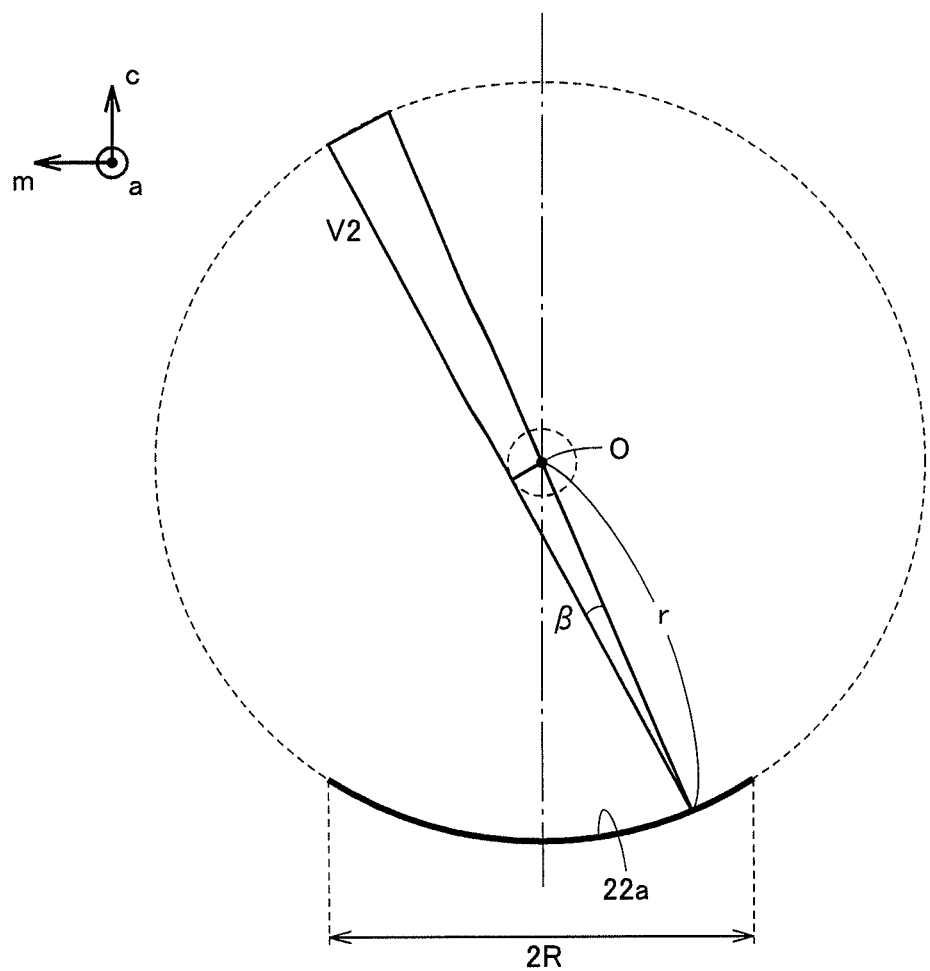
FIG. 19 is a schematic view for further considering a sliced flat plane V2 in Example 1.
Figure 20:
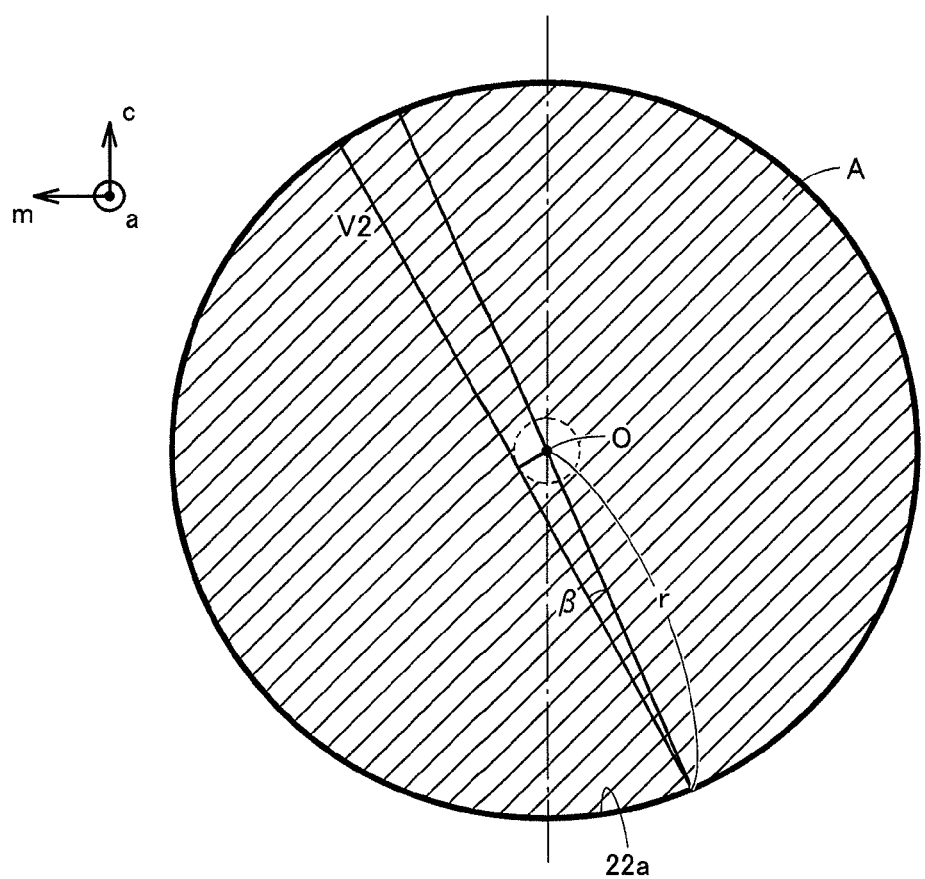
FIG. 20 is a schematic view for further considering sliced flat plane V2 in Example 1.
Figure 21:
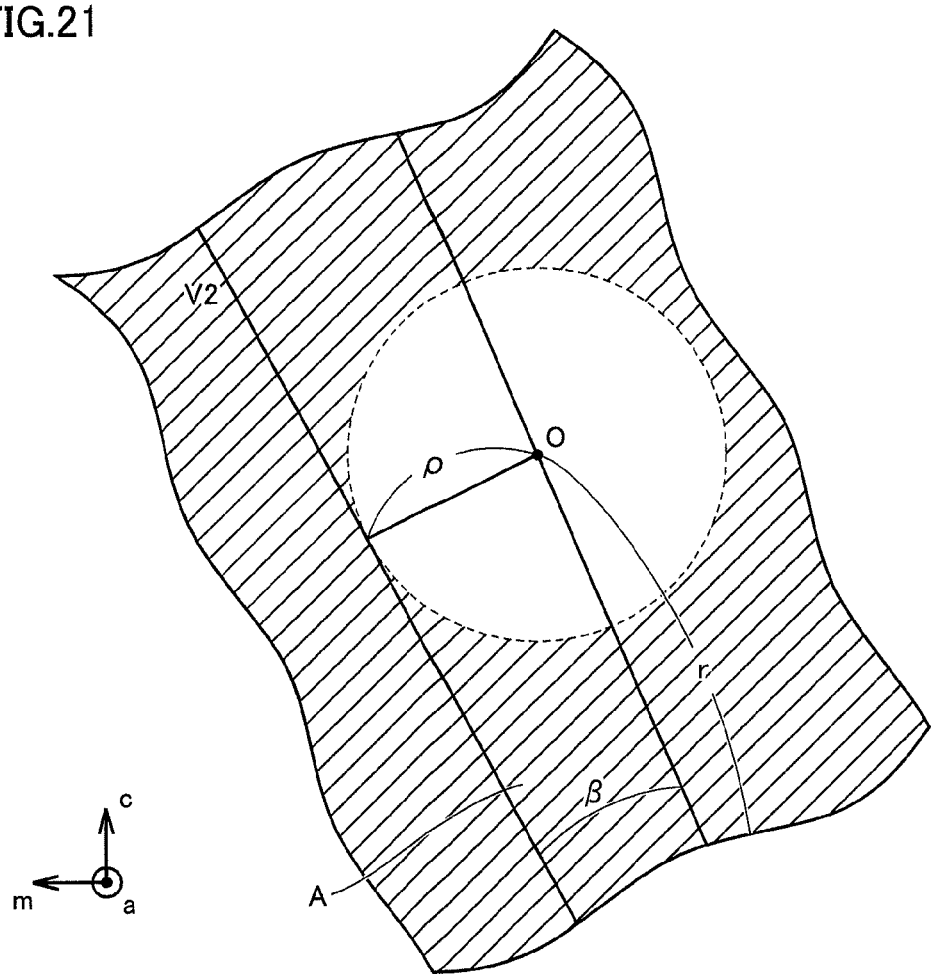
FIG. 21 is a schematic view for further considering sliced flat plane V2 in Example 1.

FIGS. 19 to 21 are schematic views for further considering sliced flat plane V2. Although the shape of the nitride crystal has been considered as a portion of the arc with radius r and center O in the example shown in FIG. 17 and in the example shown in FIG. 18, the shape of the nitride crystal (front surface 22a) will be considered as an entire arc as shown in FIGS. 20 and 21. In this case, it can be seen that any plane not passing through a region with a radius ρ (ρ=r×sin β) around center O (any plane passing through a region A in FIGS. 20 and 21) falls under sliced flat plane V2 for cutting the nitride substrate in which the off angle from the m-plane is β. In other words, any plane with a distance of ρ from center O falls under flat plane V2. The distance from center O means a length of a perpendicular extending from center O to any plane.

Figure 22:
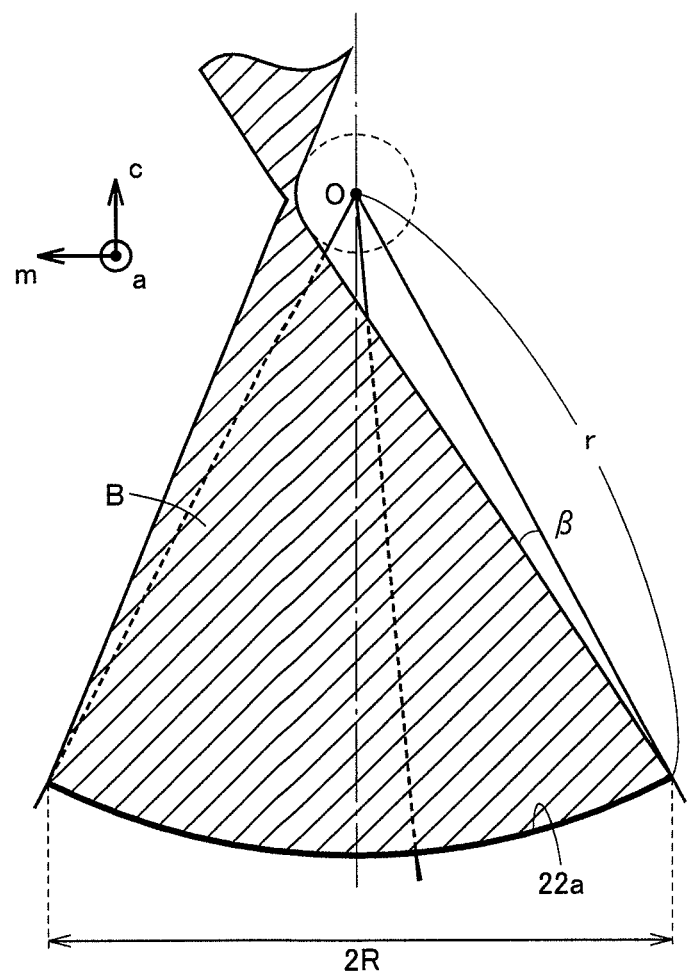
FIG. 22 is a schematic view for further considering sliced flat plane V2 in Example 1.
Figure 23:
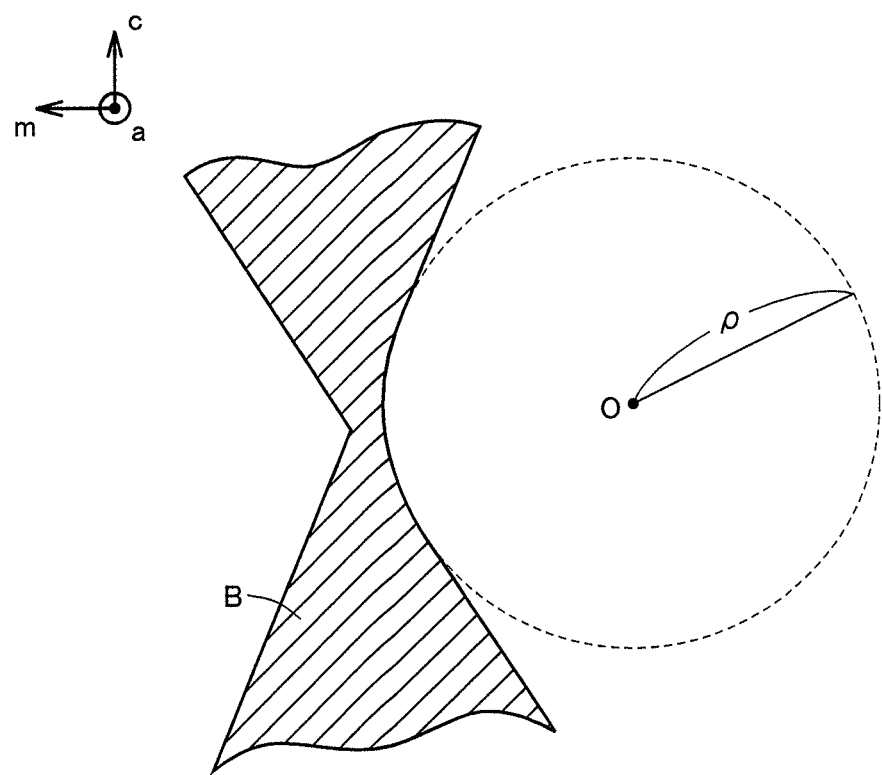
FIG. 23 is a schematic view for further considering sliced flat plane V2 in Example 1.

However, since the nitride crystal is actually merely a portion of the arc with radius r and center O, flat plane V2 along which the nitride crystal can be sliced is a portion thereof. FIGS. 22 and 23 show this state. It can be seen that flat plane V2 along which the nitride substrate actually having an off angle of β can be sliced from the nitride crystal is in the portion of a region B in FIGS. 22 and 23. Here, for brevity, only a case where off angle β is placed on the left side of a normal on front surface 22a of the nitride crystal is shown, and a case where off angle β is placed on the right side thereof will not be provided.

Therefore, based on the above consideration, it has been found that flat plane V2 for cutting the nitride substrate in which the off angle from the m-plane is β has the following two conditions:

(1) flat plane V2 has a distance of p from center O; and (2) flat plane V2 has a portion common to front surface 22a of the nitride crystal.

From the foregoing, it has been found that sliced flat plane V2 for obtaining the nitride substrate in which the off angle is β can be readily determined and sliced by measuring the position of center O, radius of curvature r, and diameter 2R of the nitride crystal in the case where front surface 22a of the nitride crystal is approximated as an arc, with X-ray diffraction, a ruler, a caliper, and the like, respectively.

(Slicing Method 2)

Figure 24:
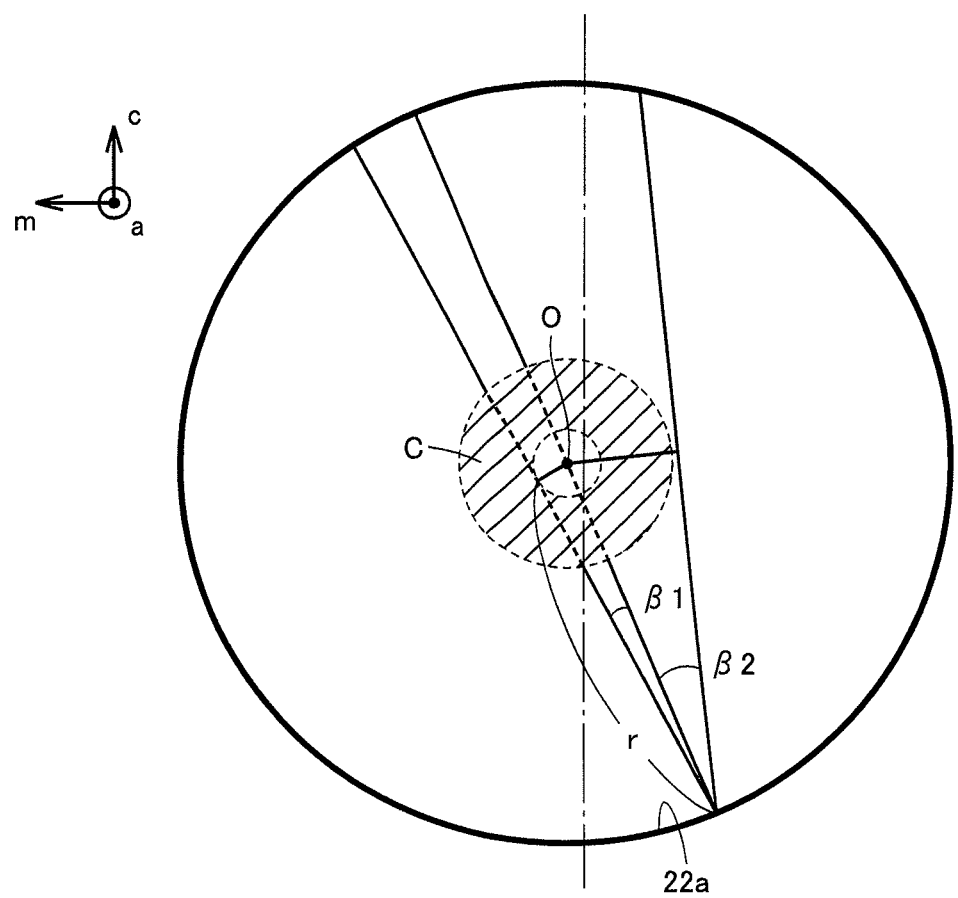
FIG. 24 is a schematic view for considering a sliced flat plane V3 in Example 1.
Figure 25:
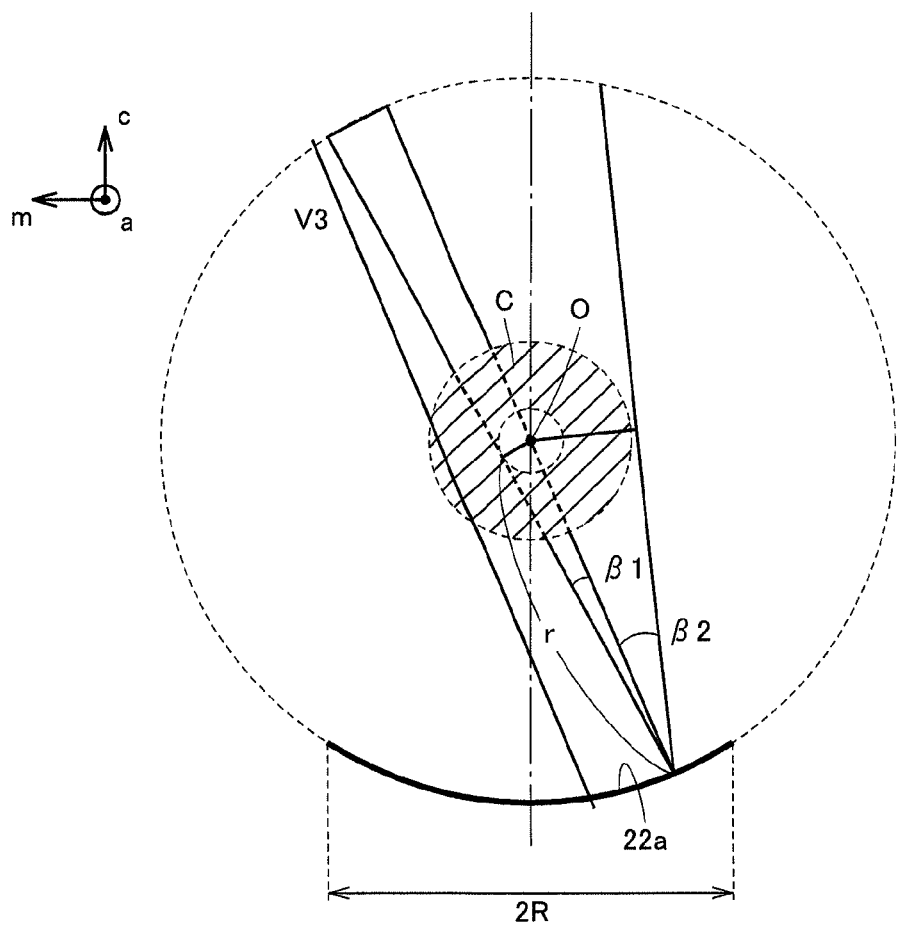
FIG. 25 is a schematic view for considering sliced flat plane V3 in Example 1.

A method of cutting a nitride substrate in which an off angle from the m-plane is in a range of β1 to β2 (β1<β2) will be considered with reference to FIGS. 24 and 25. FIGS. 24 and 25 are schematic views for considering a sliced flat plane V3.

Based on the consideration similar to that in Slicing Method 1 described above, it has been found that flat plane V3 for cutting the nitride substrate in which the off angle from the m-plane is β1 to β2 has the following two conditions:

(1) in flat plane V3, distance ρ from center O satisfies r×sin β1<ρ<r×sin β2 (a region C in FIGS. 24 and 25); and (2) flat plane V3 has a portion common to front surface 22a of the nitride crystal.

From the foregoing, it has been found that sliced flat plane V3 for obtaining the nitride substrate in which the off angle is β1 to β2 can be readily determined and sliced by measuring the position of center O, radius of curvature r, and diameter 2R of the nitride crystal in the case where front surface 22a of the nitride crystal is approximated as an arc, with X-ray diffraction, a ruler, a caliper, and the like, respectively.

(Slicing Method 3)

Figure 26:
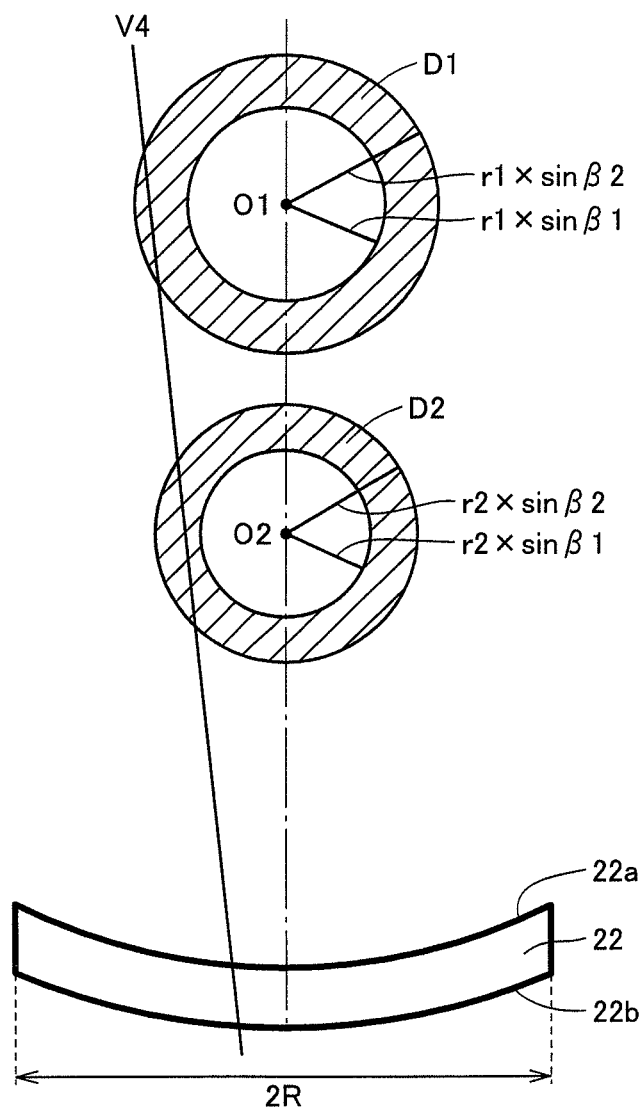
FIG. 26 is a schematic view for considering a sliced flat plane V4 in Example 1.

An effect of the thickness of the nitride crystal ignored for brevity in Slicing Methods 1 and 2 described above will be considered with reference to FIG. 26. FIG. 26 is a schematic view for considering a sliced flat plane V4.

When front surface 22a and rear surface 22b of a prepared nitride crystal are measured by X-ray diffraction, it is found that the nitride crystal has front surface 22a which can be approximated as a portion of an arc with a radius r1 and center O1, and rear surface 22b which can be approximated as a portion of an arc with a radius r2 and center O2. Based on the foregoing discussion, it is only necessary to consider spherical surfaces with radii of r1×sin β1, r1×sin β2 determined depending on the range of the off angle from β1 to β2 (β1<β2) around center O1, and also consider spherical surfaces with radii of r2×sin β1, r2×sin β2 around center O2.

Therefore, it has been found that flat plane V4 for cutting a nitride substrate in which an off angle from the m-plane is β1 to β2 has the following three conditions:

(1) in flat plane V4, distance ρ from center O1 satisfies r1×sin β1<ρ<r1×sin β2 (a region D1 in FIG. 26);

(2) in flat plane V4, distance ρ from center O2 satisfies r2×sin β1<ρ<r2×sin β2 (a region D2 in FIGS. 26); and (3) flat plane V4 has a portion common to front surface 22a and rear surface 22b of the nitride crystal.

From the foregoing, it has been found that sliced flat plane V4 for obtaining the nitride substrate in which the off angle is β1 to β2 can be readily determined and sliced by measuring the positions of centers O1, O2, radii of curvature r1, r2, and diameter 2R of the nitride crystal in the case where front surface 22a and rear surface 22b of the nitride crystal are approximated as arcs, with X-ray diffraction, a ruler, a caliper, and the like, respectively.

Since the change in the radius of curvature in a growth thickness direction of the nitride crystal is considered as monotonic change in a good crystal, slicing can be performed with accuracy merely by focusing attention on the front surface and the rear surface as considered above.

Further, the c-plane other than the front surface and the rear surface of the nitride crystal can also be considered by increasing an arc with a center and a radius of curvature. As an effect of considering in that manner, the change in the radius of curvature in the growth thickness direction can be grasped more correctly, and distribution of the off angle within the sliced nitride substrate can be further improved. For example, in a case where nitride crystal 22 does not have good quality, or where nitride crystal 22 is grown in the c-axis direction using a substrate having an off angle as base substrate 21, a sliced plane for obtaining a substrate having a controlled off angle can be determined with more accuracy by increasing an arc with a center and a radius of curvature for the c-plane other than the front surface and the rear surface and performing similar consideration. The center and the radius of curvature in the c-plane inside nitride crystal 22 can be measured by the X-ray Diffraction (XRD) method, for example by exposing a location thereof.

Although the methods of slicing a nitride substrate having an off angle with respect to the m-plane have been considered in Slicing Methods 1 to 3 described above, Slicing Methods 1 to 3 can also be applied to a method of slicing a nitride substrate having an off angle with respect to the a-plane. That is, Slicing Methods 1 to 3 can be applied to a slicing method cutting a nitride substrate such that the off angle formed between the axis orthogonal to the front surface and the m-axis or the a-axis is greater than zero.

A method of cutting a nitride substrate such that, with regard to the first region included in the front surface of the nitride substrate and the second region surrounding the first region, the second region is within 2 mm from the edge can also be considered similarly. That is, if the nitride substrate is sliced with coordinates of slicing points 1 and 2 specified in Example 2 described later being corrected, the nitride substrate can be cut such that the second region is within 2 mm from the edge.

EXAMPLE 2

In the present example, a concrete slicing method for cutting a nitride substrate from a grown nitride crystal such that the off angle formed between the axis orthogonal to the front surface and the m-axis or the a-axis is greater than zero was considered. To consider the slicing method, a coordinate system fixed to a nitride crystal shown in FIG. 27 was defined to specify a slicing position.

Figure 27:
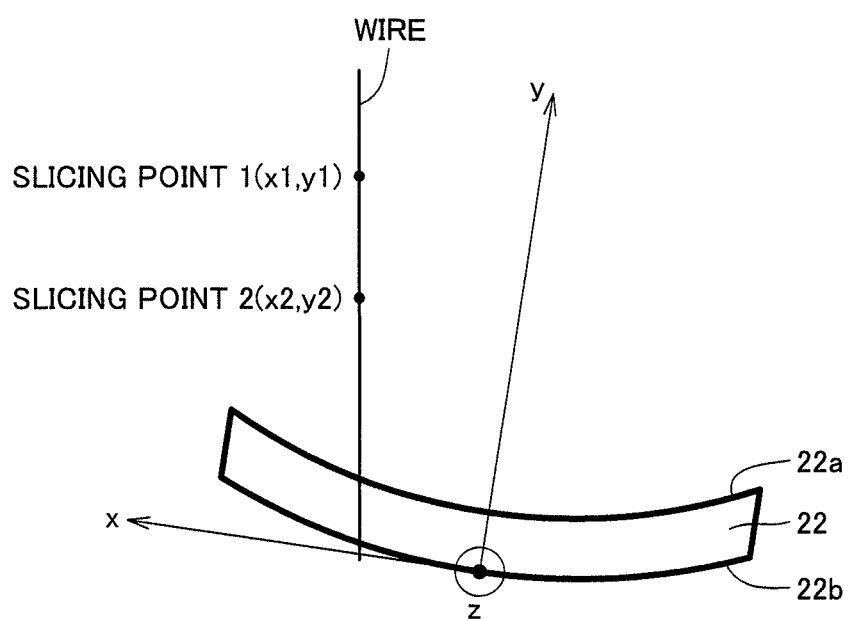
FIG. 27 is a schematic view for illustrating a method of designating a location for slicing a nitride crystal in Example 2.

FIG. 27 is a schematic view for illustrating a method of designating a location for slicing a nitride crystal in the present example. As shown in FIG. 27, a coordinate origin was set at a center of rear surface 22b of the nitride crystal, a y-axis direction was set along the c-axis (i.e., the axis of rotational symmetry of the crystal), and a z-axis direction was set in a direction in which a wire of a wire saw reciprocates. When a nitride substrate with the m-plane (the a-plane) having an off angle was obtained, the a-axis (the m-axis) was oriented frontward (a z-direction). Slicing was performed using the wire to pass through two slicing points (slicing points 1, 2) designated by the coordinate system. The coordinates of slicing points 1 and 2 were set to (x1,y1), (x2,y2), respectively. In addition, since the wire moved in the vertical direction, the nitride crystal was inclined by a jig (not shown) such that a sliced plane was vertical.

Cases 1 to 3 of the present invention and Comparative Example 1 below describe the details. Table 1 below describes manufacturing conditions and results of manufactured nitride substrates in Cases 1 to 3 of the present invention and Comparative Example 1.

TABLE 1

|  | Case 1 of Present Invention | Case 2 of Present Invention | Case 3 of Present Invention | Comparative Example 1 |
|---|---|---|---|---|
| Nitride single crystal | AlN | GaN | GaN | AlN |
| Radius of curvature on front surface side (m) | 1.0 | 5.0 | 11.0 | 1.0 |
| Radius of curvature on rear surface side (m) | 1.1 | 5.5 | 10.5 | 1.1 |
| Radius of crystal (mm) | 25 | 37.5 | 50 | 25 |
| Thickness at center of crystal (mm) | 10 | 20 | 35 | 10 |
| Coordinate (x, y) of slicing point 1 (mm) | (8, 1010) | (19, 5020) | (211, 11035) | (0, 1010) |
| Coordinate (x, y) of slicing point 2 (mm) | (10, 1100) | (22, 5500) | (202, 10500) | (0, 1100) |
| Substantial plane orientation of sliced substrate | m | m | a | m |
| Number of sliced substrates obtained (number) | 1 | 2 | 2 | 2 |
| Grinding/polishing step | Performed | Not performed | Performed | Performed |
| Range of off angle (deg) | 0.4 to 0.6 | 0.15 to 0.3 | 1 to 1.2 | 0 |

(Case 1 of Present Invention)

A 2-inch SiC substrate having a (0001) plane as a main surface was prepared, and an MN single crystal was grown on the substrate as base substrate 21 by the sublimation method.

Figure 6:
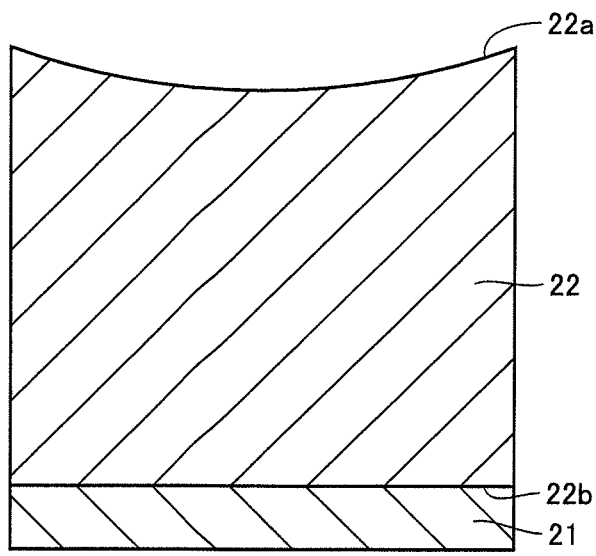
FIGS. 6(A) and 6(B) are cross sectional views schematically showing a nitride crystal in the embodiment of the present invention.
Figure 6:
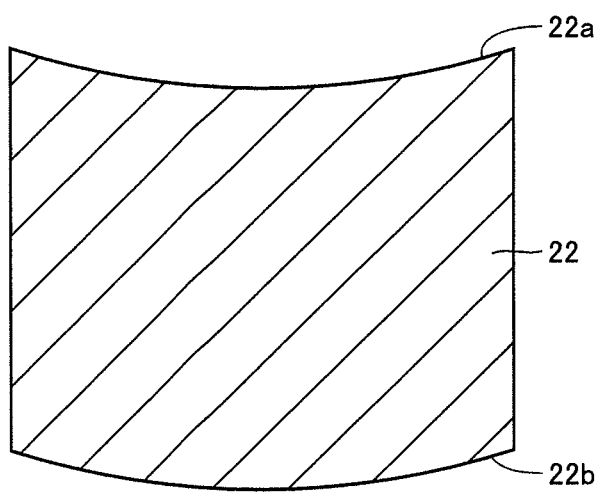
Figure 7:
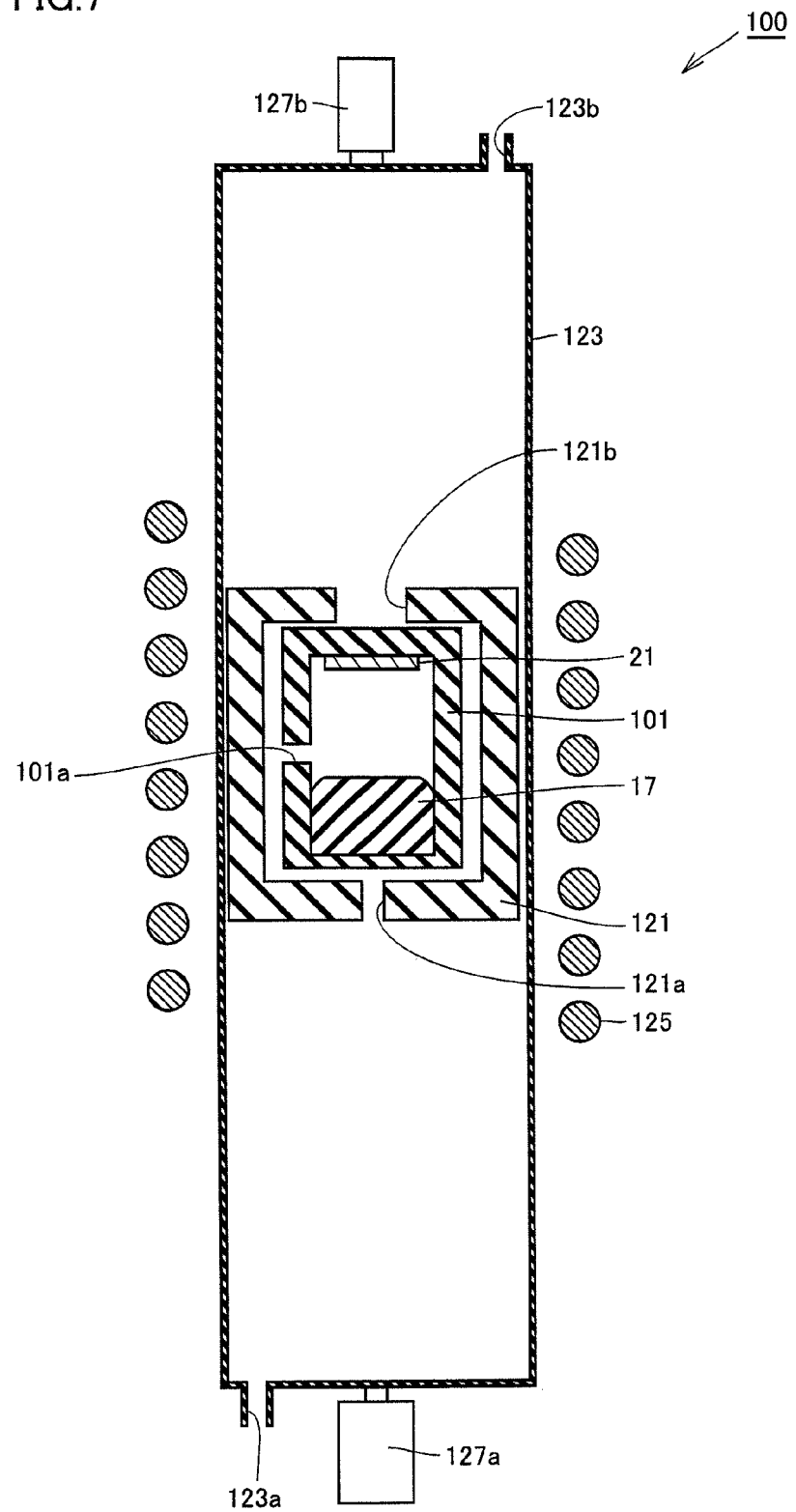
FIG. 7 is a growth apparatus capable of being used to manufacture the nitride crystal in the embodiment of the present invention.

Specifically, base substrate 21 was placed at the upper portion of crucible 101 shown in FIG. 6. On this occasion, a front surface of base substrate 21 was flattened, and a base substrate protection material made of graphite was placed on a rear surface side to closely adhere thereto to suppress sublimation of base substrate 21. Further, an MN powder raw material was prepared, and placed as raw material 17 at the lower portion of crucible 101 to face base substrate 21 with each other.

Thereafter, the temperature within crucible 101 was increased by heating heat body 121 using heating portion 125 while causing the nitrogen gas to flow into reaction vessel 123. Heating was performed such that base substrate 21 had a temperature of 2000° C. and raw material 17 had a temperature of 2200° C., to grow an MN single crystal having a thickness of 30 µm, and the MN single crystal was further grown for 100 hours. Thereafter, the MN single crystal was cooled down to a room temperature, and the SiC substrate was removed. Thereby, an MN single crystal as nitride crystal 22 having a growth thickness of about 10 mm in the c-axis direction was obtained.

When crystallinity in both a front surface and a rear surface of the obtained MN single crystal was evaluated using X-ray diffraction, it was found that the MN single crystal was a good single crystal having a half-value width of about 100 seconds. It was found from a result of measurement of (0002) rocking curves at many points that the single crystal was warped in a rotationally symmetric shape that was upwardly concave with the c-axis direction being oriented upward. The front surface had a radius of curvature of 1.0 m, and the rear surface had a radius of curvature of 1.1 m. It was confirmed that the shape of the c-plane can be approximated as an arc. It was confirmed that the single crystal was in a state as schematically shown in FIGS. 26 and 27.

The AlN single crystal was set on a wire saw with a plane orientation thereof being checked, and sliced along a flat plane passing through slicing point 1 and slicing point 2 indicated in Table 1. Thereby, one MN substrate was obtained.

Thereafter, grinding was performed using a grindstone containing diamond abrasive grains, and polishing was performed using slurry containing diamond abrasive grains. Thereby, an MN substrate of Case 1 of the present invention was manufactured. Through grinding and polishing, a front surface of the nitride substrate of Case 1 of the present invention was able to be flattened. Therefore, an epitaxial layer was able to be fabricated more easily using the nitride substrate of Case 1 of the present invention, when compared with a nitride substrate of Case 2 of the present invention not subjected to grinding and polishing described later.

When measurement of in-plane mapping of an off angle was performed on the manufactured AlN substrate by X-ray diffraction to examine the range of distribution, an MN substrate in which a front surface was substantially the m-plane and did not include a region where the off angle was zero, and which had an off angle particularly preferable for epitaxial growth in the entire region of the front surface was obtained.

(Case 2 of Present Invention)

A 3-inch GaAs substrate having a (111) plane as a main surface was prepared, and an entire front surface of the GaAs substrate was covered with a thin mask. $SiO_2$ (silicon dioxide) was used as a material for the mask, as it has a property that does not allow GaN to grow directly thereon. A window was formed in the mask, and GaN was epitaxially grown through the window by the HVPE method.

In an HVPE furnace used for the growth, a Ga boat was provided at an upper portion inside the vertically long furnace, and a Ga melt was held therein. A susceptor was provided at a lower portion of the furnace, and the GaAs substrate was set thereon. A heater was provided around the furnace to heat the furnace. A mixed gas containing hydrogen gas and HCl gas was introduced from a gas inlet. HCl reacted with Ga to synthesize GaCl, and GaCl in the form of a gas flew downward. A mixed gas containing hydrogen gas and $NH_3$ gas was introduced from the gas inlet. GaCl reacted with $NH_3$ to synthesize GaN, and GaN was deposited on the GaAs substrate. A buffer layer was firstly grown at a low temperature (490° C.), and thereafter the temperature was increased and epitaxial growth was performed at a high temperature (1010° C.). Thus, a GaN single crystal having a thickness of 20 mm was grown as nitride crystal 22. Thereafter, the base substrate was removed by etching with aqua regia. Thereby, a GaN single crystal as nitride crystal 22 shown in FIG. 6(B) was obtained.

When crystallinity in both a front surface and a rear surface of the obtained GaN single crystal was evaluated as in Case 1 of the present invention, it was found that the GaN single crystal had a half-value width of about 100 seconds. In addition, warped shapes were confirmed using X-ray diffraction (see Table 1).

Base on that, wire slicing was performed along a flat plane passing through slicing points 1, 2 described in Table 1 to obtain two GaN substrates, and thus a GaN substrate of Case 2 of the present invention was manufactured. Since grinding and polishing were not performed after the slicing in Case 2 of the present invention, a front surface was not able to be flattened when compared with that in Case 1 of the present invention. However, an epitaxial layer was also able to be formed using the nitride substrate.

When distribution of an off angle was evaluated for the manufactured GaN substrate, it was confirmed that the GaN substrate had a front surface which was substantially the m-plane and did not include an off angle of zero.

(Case 3 of Present Invention)

A GaN single crystal grown in an HVPE furnace similar to that in Case 2 of the present invention was prepared. Similarly, it was confirmed that crystallinity in both a front surface and a rear surface of the obtained GaN single crystal was about 100 seconds, and warped shapes were also confirmed, using X-ray diffraction (see Table 1).

Based on that, in this case, to obtain a substrate with substantially the a-plane, the GaN single crystal was set on a wire saw with a direction thereof being changed from that in Case 2 of the present invention. Specifically, wire slicing was performed along a flat plane passing through slicing points 1, 2 described in Table 1 to obtain two substrates. After the slicing, grinding and polishing were performed as in Case 1 of the present invention. Thereby, a GaN substrate of Case 3 of the present invention was manufactured.

When distribution of an off angle was evaluated by performing X-ray diffraction measurement on the manufactured GaN substrate, it was confirmed that the GaN substrate had a front surface which was substantially the a-plane and did not include an off angle of zero.

COMPARATIVE EXAMPLE 1

An AlN single crystal in a warped shape as in Case 1 of the present invention was prepared, and sliced with a wire saw along a sliced flat plane described in Table 1, which was different from the slicing methods in Cases 1 to 3 of the present invention. After the slicing, grinding and polishing were performed as in Case 1 of the present invention.

When distribution of an off angle was evaluated by performing X-ray diffraction measurement on a manufactured MN substrate, a substrate with the m-plane was obtained, but it was an MN substrate having an off angle of zero which is not preferable for epitaxial growth.

Although the embodiment and examples of the present invention have been described above, it is originally intended to combine features of the embodiment and examples as appropriate. Further, it should be understood that the embodiment and examples disclosed herein are illustrative and non-restrictive in every respect. The scope of the present invention is defined by the scope of the claims, rather than the embodiment described above, and is intended to include any modifications within the scope and meaning equivalent to the scope of the claims.

Description Of The Reference Signs

10: nitride substrate, 11, 22a: front surface, 12: first region, 13: second region, 13a: first point, 13b: second point, 17: raw material, 21: base substrate, 22: nitride crystal, 22b: rear surface, 100: growth apparatus, 101: crucible, 101a: air exhaust outlet, 121: heat body, 121a, 123a: inlet, 121b, 123b: outlet, 123: reaction vessel, 125: heating portion, 127a, 127b: radiation thermometer, T1, T2, T3, U1, U2, U3, W1, W2, W3, V1, V2, V3, V4: flat plane, O, O1, O2: center.

The invention claimed is:

1. A nitride substrate including a front surface, wherein an off-angle formed between an axis orthogonal to said front surface and an a-axis or an m-axis is greater than zero.
   said front surface has a first region and a second region surrounding said first region,
   said off-angle of said front surface is changed in magnitude based on a position in said front surface,
   said off angle of said front surface has a minimum value at a first point in said second region, and
   said second region is within 2 mm from an edge.

2. The nitride substrate according to claim 1, wherein said off angle has a maximum value at a second point in said second region, and said off angle monotonically decreases from said second point to said first point.

3. The nitride substrate according to claim 1, wherein said front surface is inclined from an a-plane or an m-plane in a c-axis direction.

* * * * *